US009661698B2

(12) United States Patent
Huang et al.

(10) Patent No.: US 9,661,698 B2
(45) Date of Patent: May 23, 2017

(54) LIGHT EMITTING COMPONENT AND LIGHT EMITTING DEVICE USING SAME

(71) Applicant: Formosa Epitaxy Incorporation, Taoyuan County (TW)

(72) Inventors: Chih-Shu Huang, Taoyuan County (TW); Chun-Ju Tun, Taoyuan County (TW); Shyi-Ming Pan, Taoyuan County (TW); Wei-Kang Cheng, Taoyuan County (TW); Keng-Ying Liao, Taoyuan County (TW)

(73) Assignee: EPISTAR CORPORATION, Hsinchu (TW)

(*) Notice: Subject to any disclaimer, the term of this patent is extended or adjusted under 35 U.S.C. 154(b) by 224 days.

(21) Appl. No.: 14/522,592

(22) Filed: Oct. 24, 2014

(65) Prior Publication Data

US 2015/0061526 A1    Mar. 5, 2015

Related U.S. Application Data

(62) Division of application No. 13/769,828, filed on Feb. 19, 2013, now Pat. No. 9,220,135.

(30) Foreign Application Priority Data

Feb. 21, 2012  (TW) .............................. 101105652 A
Nov. 13, 2012  (TW) .............................. 101142263 A

(51) Int. Cl.
*H01L 27/15*     (2006.01)
*H05B 33/08*     (2006.01)
(Continued)

(52) U.S. Cl.
CPC ..... *H05B 33/0815* (2013.01); *H01L 27/0629* (2013.01); *H01L 27/15* (2013.01);
(Continued)

(58) Field of Classification Search
USPC ......................................... 315/201, 250, 258
See application file for complete search history.

(56) References Cited

U.S. PATENT DOCUMENTS 4,777,516 A * 10/1988 Deschler ................. H01L 27/15
                                                             257/93
5,567,961 A * 10/1996 Usagawa ............ H01L 27/0605
                                                            257/192
(Continued)

FOREIGN PATENT DOCUMENTS

| CN | 101281314 | 10/2008 |
| TW | 200411949 | 7/2004 |
| TW | I299196 | 7/2008 |

OTHER PUBLICATIONS

"Office Action of Taiwan Counterpart Application", issued on Aug. 11, 2014, p. 1-p. 5.

*Primary Examiner* — Douglas W Owens
*Assistant Examiner* — Srinivas Sathiraju
(74) *Attorney, Agent, or Firm* — Muncy, Geissler, Olds & Lowe, P.C.

(57) ABSTRACT

A light emitting device including a light emitting component is provided, wherein said light emitting comprising an integrated light emitting diode and a semiconductor field effect transistor. The semiconductor field effect transistor may prevent situations such as overheating and voltage instability by controlling a current passing through the light emitting diode as well as enhancing the ability to withstand electrostatic discharge and reducing cost of the light emitting device in multiple aspects.

15 Claims, 21 Drawing Sheets

(51) Int. Cl.
  *H05B 37/02*    (2006.01)
  *H01L 33/00*    (2010.01)
  *H01L 27/06*    (2006.01)
  *H01L 29/872*   (2006.01)

(52) U.S. Cl.
  CPC ........ *H01L 29/872* (2013.01); *H01L 33/0025* (2013.01); *H05B 33/0824* (2013.01); *H05B 37/02* (2013.01)

(56) References Cited

U.S. PATENT DOCUMENTS

| | | | | |
|---|---|---|---|---|
| 5,929,523 A * | 7/1999 | Parsons | ............... | H01L 21/0485 257/750 |
| 7,071,498 B2 * | 7/2006 | Johnson | ............ | H01L 21/28587 257/109 |
| 7,432,538 B2 * | 10/2008 | Kosaki | ................ | H01L 29/7787 257/192 |
| 7,528,055 B2 * | 5/2009 | Nakahata | .......... | H01L 21/02389 257/E21.601 |
| 7,750,351 B2 * | 7/2010 | Sazawa | ............. | H01L 29/66462 257/1 |
| 7,981,744 B2 * | 7/2011 | Kosaki | .............. | H01L 29/66462 438/258 |
| 8,076,699 B2 * | 12/2011 | Chen | ................... | H01L 27/0605 257/194 |
| 8,183,665 B2 * | 5/2012 | Bertin | ................... | B82Y 10/00 257/529 |
| 8,390,209 B2 * | 3/2013 | Dellian | ................... | H02M 7/08 315/224 |
| 8,441,018 B2 * | 5/2013 | Lee | ........................ | H04N 9/315 257/75 |
| 8,502,323 B2 * | 8/2013 | Chen | ................... | H01L 29/7786 257/392 |
| 8,519,636 B2 * | 8/2013 | Wen-Kuei | .......... | H05B 33/0812 315/209 R |
| 8,602,587 B2 * | 12/2013 | Lee | ........................... | F21K 9/17 362/217.14 |
| 8,674,610 B2 * | 3/2014 | Briggs | ............... | H05B 33/0818 315/152 |
| 8,680,889 B2 * | 3/2014 | Leshniak | ........... | H05B 33/0803 315/185 R |
| 2002/0024050 A1 * | 2/2002 | Odekirk | ............. | H01L 21/0485 257/77 |
| 2005/0003574 A1 * | 1/2005 | Yang | ...................... | B82Y 10/00 438/99 |
| 2005/0118752 A1 * | 6/2005 | Otsuka | .................... | C30B 25/02 438/172 |
| 2006/0249750 A1 * | 11/2006 | Johnson | ............ | H01L 21/28587 257/192 |
| 2007/0278523 A1 * | 12/2007 | Lin | ..................... | H01L 21/8252 257/194 |
| 2008/0212361 A1 * | 9/2008 | Bertin | ................. | H01L 27/1021 365/151 |
| 2009/0032820 A1 * | 2/2009 | Chen | ................... | H01L 29/7786 257/76 |
| 2010/0019279 A1 * | 1/2010 | Chen | ................... | H01L 27/0605 257/194 |
| 2010/0213467 A1 * | 8/2010 | Lee | ........................ | H04N 9/315 257/75 |
| 2012/0049216 A1 * | 3/2012 | Ting | .................... | H01L 25/0753 257/98 |
| 2013/0001516 A1 * | 1/2013 | Hebard | ............... | H01L 29/1606 257/29 |
| 2014/0014949 A1 * | 1/2014 | Kimura | ............... | H01L 27/3213 257/43 |
| 2014/0097429 A1 * | 4/2014 | Kim | .................... | H01L 27/1262 257/48 |

* cited by examiner

LIGHT EMITTING COMPONENT AND LIGHT EMITTING DEVICE USING SAME

CROSS-REFERENCE TO RELATED APPLICATION

This application is a divisional application of U.S. application Ser. No. 13/769,828, filed on Feb. 19, 2013. The prior application Ser. No. 13/769,828 claims the priority benefits of Taiwan application serial no. 101142263, filed on Nov. 13, 2012, and Taiwan application serial no. 101105652, filed on Feb. 21, 2012. The entirety of each of the above-mentioned patent applications is hereby incorporated by reference herein and made a part of this specification.

BACKGROUND OF THE INVENTION

1. Field of the Invention

The present invention generally relates to a light emitting component, in particular, to a light emitting component comprising an integrated light emitting diode and a semiconductor field effect transistor, and a light emitting device using same.

2. Description of Related Art

Semiconductor light emitting diodes (LEDs) have many advantages and possess characteristics of long lifetime, power saving, low contamination, compact and lightweight form factor, low fragility, high switching speed, and high reliability at normal temperatures, therefore light emitting diodes serve as light emitting components used in more and more light emitting devices in different applications such as backlight unit, flashlight, or street light for example.

However, the light emitting efficiency of the light emitting diode may be reduced by the influence of temperature. At high temperatures, a higher current passes through the light emitting diode and produces more heat under the same voltage. Such a vicious cycle not only wastes electricity but also shortens the lifetime of the light emitting diode. And therefore, ordinary light emitting devices incorporating light emitting diodes have to spend additional costs on radiating.

SUMMARY OF THE INVENTION

To overcome the problems, light emitting devices must comprise circuit to control the light emitting diodes and maintain the reliability and efficiency. Therefore, more and more electronic components are incorporated in the devices, and integration or hybrid technologies are developed. A field effect transistor (FET) is one of examples which may be manufactured using semiconductor epitaxy technology, as disclosed in U.S. Pat. Nos. 7,432,538, 7,750,351 and 7,981,744. However, these patents were failed to disclose how to incorporate with an LED and related application. In U.S. Pat. No. 4,777,516, Deschler disclosed a III-arsenide light emitting diode and a traditional field effect transistor formed in succession on a same growth substrate, wherein the field effect transistor is formed by applying silicon ion implantation to a gallium arsenide layer. However, the process of Deschler's invention was complicated, expensive and reduced the reliability of LED, and hard to use in different LED applications or situations.

The present invention is directed to a light emitting component comprising an integrated light emitting diode (LED) and semiconductor field effect transistor, wherein said light emitting diode and said semiconductor field effect transistor are formed on a same growth substrate.

The present invention is directed to a light emitting device comprising an integrated light emitting diode (LED) and semiconductor field effect transistor, wherein said light emitting diode and said semiconductor field effect transistor are formed on a same growth substrate, and wherein a current passing through said light emitting diode may be controlled by said semiconductor field effect transistor so as to prevent said light emitting diode from lifetime shortening due to overheating.

The aforementioned light emitting component includes a semiconductor field effect transistor formed on a growth substrate, wherein the semiconductor field effect transistor includes a base layer, a channel semiconductor layer formed on the base layer, a source semiconductor layer formed on the channel semiconductor layer, a drain semiconductor layer also formed on the channel semiconductor opposite to the source semiconductor layer, a gate electrode formed a Schottky contact with the channel semiconductor layer, a source electrode and a drain electrode respectively formed ohmic contacts with the source semiconductor layer and the drain semiconductor layer.

According to an embodiment of the present invention, the aforementioned base layer is a p-type III-nitride. The channel semiconductor layer, the source semiconductor layer, and the drain semiconductor layer are n-type III-nitrides.

According to an embodiment of the present invention, an active layer, a first type semiconductor layer, and a buffer layer are further included between the aforementioned semiconductor field effect transistor and the growth substrate, wherein the first type semiconductor layer is an n-type III-nitride.

According to an embodiment of the present invention, a material of the aforementioned gate electrode is selected from any or a combination of tungsten, platinum, gold, nickel, and aluminum, and materials of the source electrode and the drain electrode are selected from any or a combination of titanium, aluminum, nickel, and gold.

According to an embodiment of the present invention, doping concentrations of the aforementioned source semiconductor layer and the drain semiconductor layer are adjusted to be different from that of the channel semiconductor layer.

According to an embodiment of the present invention, the aforementioned light emitting component further includes a Schottky diode formed on the growth substrate, wherein the Schottky diode includes an anode semiconductor layer, a cathode semiconductor layer, an anode electrode, and a cathode electrode. The cathode semiconductor is formed on top of the anode semiconductor layer. The anode electrode and the cathode electrode respectively form a Schottky contact and an ohmic contact with the anode semiconductor layer and the cathode semiconductor layer.

A light emitting device provided in the present invention includes a light emitting component, a circuit pattern, and a power source. The circuit pattern electrically connects the semiconductor field effect transistor to form a current stabilizing unit and electrically couples the current stabilizing unit to the light emitting diode. The power source is coupled to the light emitting diode and the current stabilizing unit via the circuit pattern. The semiconductor field effect transistor controls a current passing through the light emitting diode via the voltage on the gate electrode. The current stabilizing unit may further include the aforementioned Schottky diode.

A current passing through the light emitting diode is controlled by the integrated semiconductor field effect transistor, so as to suppress a temperature effect of the light emitting diode and prevent the light emitting diode from lifetime shortening due to overheating, so that the radiating cost of the light emitting device may be reduced. Additionally, since the semiconductor field effect transistor and the light emitting diode are integrated, the manufacturing cost and the size of the light emitting device may be saved. Additionally, the semiconductor field effect transistor formed of III-nitrides could operate under high power and high voltage, especially suited to rectifying circuits and stabilizing circuits essential to alternating-current and high-voltage light emitting devices so as to prevent the light emitting diode from internal or external conditions such as instabilities of forward voltage or mains voltage.

In order to make the aforementioned and other objects, features and advantages of this invention comprehensible, preferred embodiments accompanied with figures are described in detail below. Also, wherever possible, same reference numbers are used in the drawings and the description to refer to the same or like parts.

DESCRIPTION OF THE EMBODIMENTS

The First Embodiment

Figure 1:
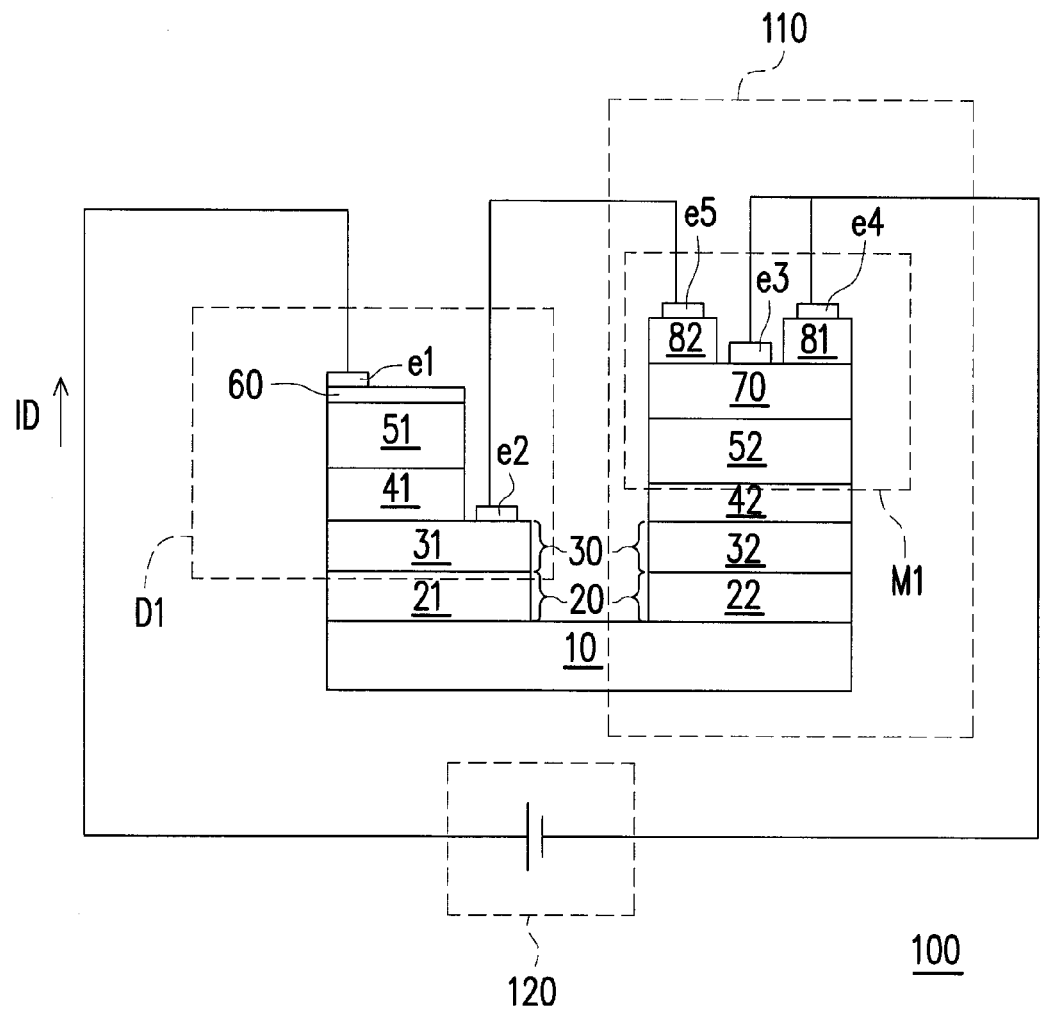
FIG. 1 is a physical schematic diagram of a light emitting device 100 according to an embodiment of the present invention.

FIG. 1 is a physical schematic diagram of a light emitting device 100 according to an embodiment of the present invention. Referring to FIG. 1, the light emitting device 100 includes a current stabilizing unit 110, a power source 120, and a diode D1, wherein the diode D1 is a light emitting diode and formed on a growth substrate 10. The growth substrate 10 is, for example, a sapphire substrate commonly used for forming light emitting diodes. In a manufacturing process for a light emitting diode (LED), the LED may typically comprise layers such as a buffer layer 20, a first type semiconductor layer 30, an active layer 40, a second type semiconductor layer 50 and a transparent conductive layer (TCL) 60. The buffer layer 20 is normally formed of, for example, aluminum nitride (AlN). The first type semiconductor layer 30 may be an n-type III-nitride such as an n-type gallium nitride (n-GaN), an n-type aluminum gallium nitride (n-AlGaN), or an n-type indium gallium nitride (n-InGaN), and yet the present invention is not limited thereto. The second type semiconductor layer 50 may be a p-type III-nitride such as a p-type gallium nitride (p-GaN), a p-type aluminum gallium nitride (p-AlGaN), or a p-type indium gallium nitride (p-InGaN), and yet the present invention is not limited thereto. In the present embodiment, the LED structure may further comprise other electronic component structure, metal semiconductor field effect transistor (MESFET) or high electron mobility transistor (HEMT) for example, via etching process, selective epitaxy growth process and/or other techniques. As shown in FIG. 1, a first buffer layer 21 and a layer 22 comprised in the buffer layer 20, a first type semiconductor layer 31 and a layer 32 comprised in the first type semiconductor layer 30, a first active layer 41 and a layer 42 comprised in the active layer 40, a second type semiconductor layer 51 and a base layer 52 comprised in the second type semiconductor layer 50, are separated and stacked respectively; wherein the first active layer 41 and the second semiconductor layer 51 expose a portion of the first semiconductor layer 31. The first semiconductor layer 31, the first active layer 41, the second semiconductor layer 51, the transparent conductive layer 60, an electrode e1 and an electrode e2 constitute the light emitting diode D1. The electrode e1 may electrically connect the second semiconductor layer 51 via the transparent conductive layer 60, and the electrode e2 may electrically connect the first semiconductor layer 31.

The current stabilizing unit 110 includes a transistor M1. In an embodiment of the present invention, the transistor M1 is a MESFET or a HEMT formed on the growth substrate 10 by a III-V group semiconductor manufacturing process similar to the diode D1. A channel semiconductor layer 70 is further formed on top of the base layer 52, wherein the channel semiconductor layer 70 may be an n-type III-nitride such as an n-type gallium nitride (n-GaN), an n-type aluminum gallium nitride (n-AlGaN), or an n-type indium gallium nitride (n-InGaN), and yet the present invention is not limited thereto. When the base layer 52 and the channel semiconductor layer 70 are of opposite conductivity types, a depletion region is formed in between. The depletion region may electrically isolate the transistor M1 from each element below such as the layers 22, 32, and 42. Furthermore, a semiconductor layer 80 is formed on top of the channel semiconductor layer 70, and a source semiconductor layer 81 and drain semiconductor layer 82 are separated therefrom via, for example, an etching process and/or selective epitaxy growth process. The semiconductor layer 80, the source semiconductor layer 81 and the drain semiconductor layer 82 may be an n-type III-nitride such as an n-type gallium nitride (n-GaN), an n-type aluminum gallium nitride (n-AlGaN), or an n-type indium gallium nitride (n-InGaN), and yet the present invention is not limited thereto. Then, a gate electrode e3 and the channel semiconductor layer 70 form a Schottky contact; a source electrode e4 and a drain electrode e5 respectively form ohmic contacts with the source semiconductor layer 81 and the drain semiconductor layer 82.

Based on the above description, in an embodiment of the present invention, a material of the gate electrode e3 is selected from any or a combination of tungsten, platinum, gold, nickel, and aluminum such as tungsten (W), platinum-gold (Pt/Au) alloy, and nickel-aluminum (Ni/Al) alloy. Materials of the source electrode e4 and the drain electrode e5 are selected from any or a combination of titanium, aluminum, nickel, and gold such as titanium-aluminum (Ti/Al) alloy and titanium-aluminum-nickel-gold (Ti/Al/Ni/Au) alloy.

Figure 2:
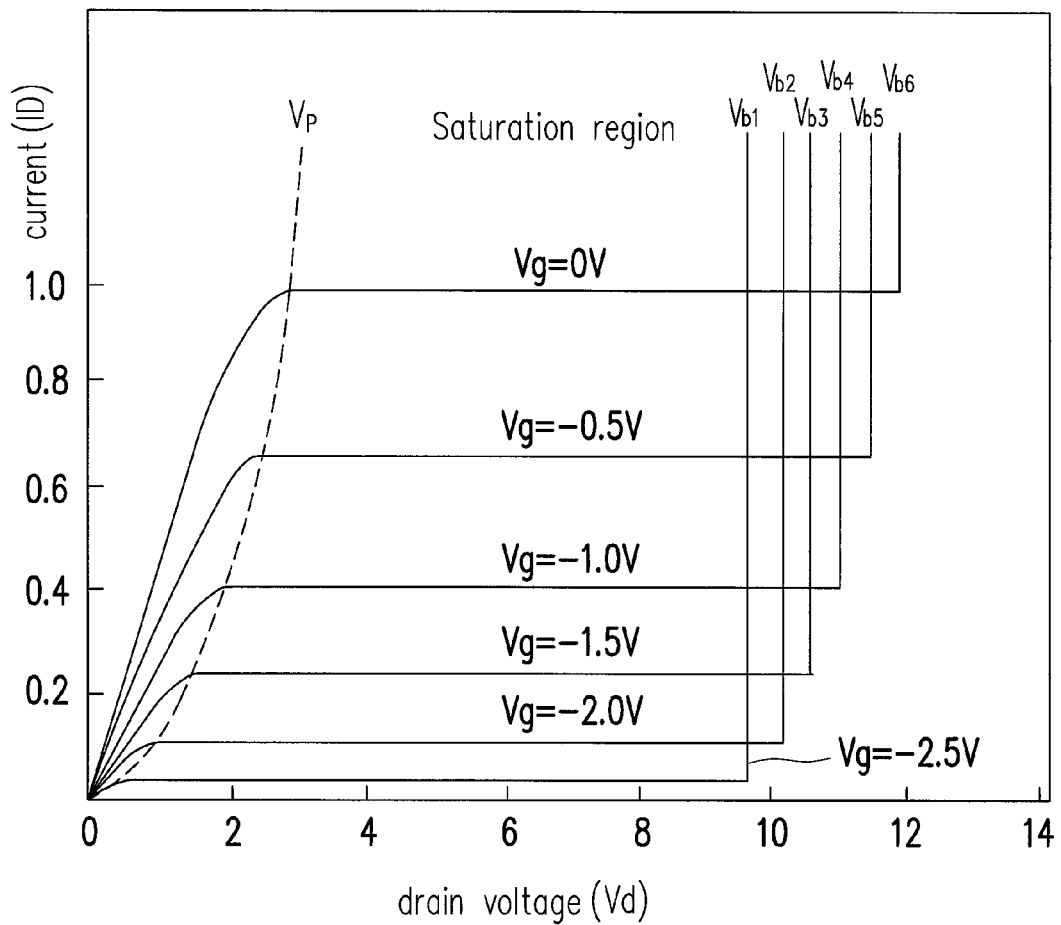
FIG. 2 is a characteristic curve of a relation between the drain voltage and the current of a semiconductor field effect transistor according to an embodiment of the present invention.

FIG. 2 is a characteristic curve of a relation between the drain voltage and the current of a semiconductor field effect transistor (i.e. the transistor M1) according to an embodiment of the present invention. Referring to both FIG. 1 and FIG. 2, in the present embodiment, if a gate voltage Vg on the gate electrode e3 of the transistor M1 is a constant (for example, if the gate voltage Vg is 0), and if a temperature of the diode D1 increases resulting in a reduced forward voltage so that a drain voltage Vd on the drain electrode e5 of the transistor M1 increases and exceeds a pinch-off voltage Vp, the transistor M1 enters a saturation region. Then, a current ID passing through the transistor M1 (i.e. the current ID passing through the diode D1) does not increase along with an increment of the drain voltage Vd until the drain voltage Vd exceeds thresholds of breakdown voltages Vb1-Vb6. Similarly, when the drain voltage Vd fluctuates due to a sudden rise or fall of a mains voltage, the current ID does not ripple along therewith.

According to the characteristic curve illustrated in FIG. 2, in an embodiment of the present invention, when the transistor M1 is in the saturation region, the current ID passing through the diode D1 may be suppressed by controlling the gate voltage Vg on the gate electrode e3 of the transistor M1. For example, if a larger current ID passing through the diode D1 is required with the transistor M1 in the saturation region, a higher gate voltage Vg may be set (e.g. 0V). If a smaller current ID passing through the diode D1 is required with the transistor M1 in the saturation region, a lower gate voltage Vg may be set (e.g. −2.5V).

On the other hand, to suppress the current ID directly via a manufacturing process, the transistor M1 may be fixed to work in the saturation region via a direct electrical coupling between the gate electrode e3 and the source electrode e4. Meanwhile, if the temperature of the diode D1 increases along with an increment of a temperature of an environment resulting in an increment of the drain voltage Vd, the current ID may not change along with the increment of the drain voltage Vd so that further increment of the temperature of the diode D1 may be suppressed.

By the way, the semiconductor layer 80 and the channel semiconductor layer 70 may be adjusted to semiconductors (e.g. n-type GaN) with different doping concentrations. Under the condition of the gate voltage Vg being a constant (e.g. under the condition of the gate voltage Vg being 0V), the current ID with the transistor M1 in the saturation region may be controlled by performing doping of different concentrations to the channel semiconductor layer 70 and the semiconductor layer 80 or adjusting a thickness (in a direction perpendicular to the growth substrate) and a width (in a direction perpendicular to the figure) of the channel of the channel semiconductor layer 70.

Based on the above description, while the diode D1 is formed on the growth substrate 10, the current stabilizing unit including an electronic component (i.e. the transistor M1) is also formed. By that means, the current passing through the diode D1 may be controlled by adjustment of the gate voltage on the transistor M1 so as to prevent the diode D1 from overheating due to excessive current. Embodiments will be illustrated in detail hereinafter with schematic diagrams of different circuits.

Figure 3A:
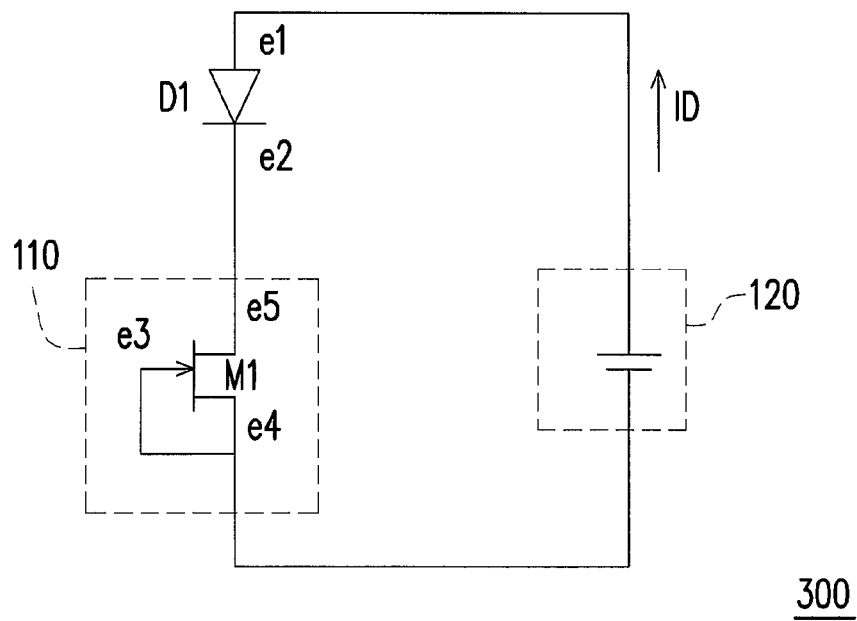
FIG. 3A is a schematic diagram of a light emitting device 300 according to an embodiment of the present invention.

FIG. 3A is a schematic diagram of a light emitting device 300 according to an embodiment of the present invention. Referring to both FIG. 1 and FIG. 3A, the embodiment of FIG. 3A is an equivalent circuit of the embodiment of FIG. 1, in which same reference numbers represent same or like elements. In the present embodiment, the light emitting device 300 includes the current stabilizing unit 110, the power source 120, and the diode D1. The diode D1 is a light emitting diode, which receives the current ID from the power source 120 and emits light accordingly. The current stabilizing unit 110 electrically connects the diode D1 and the power source 120. To be more specific, the anode electrode e1 of the diode D1 is coupled to a first terminal of the power source 120. The current stabilizing unit 110 includes the transistor M1, wherein the drain electrode e5 thereof is coupled to the cathode electrode e2 of the light emitting diode D1, and the gate electrode e3 thereof is coupled to the source electrode e4 thereof. Moreover, the source electrode e4 of the transistor M1 is coupled to a second terminal of the power source 120. In an embodiment of the present invention, the power source 120 is a direct-current power source, wherein the first terminal thereof is a power voltage and the second terminal thereof is a ground voltage.

Figure 3B:
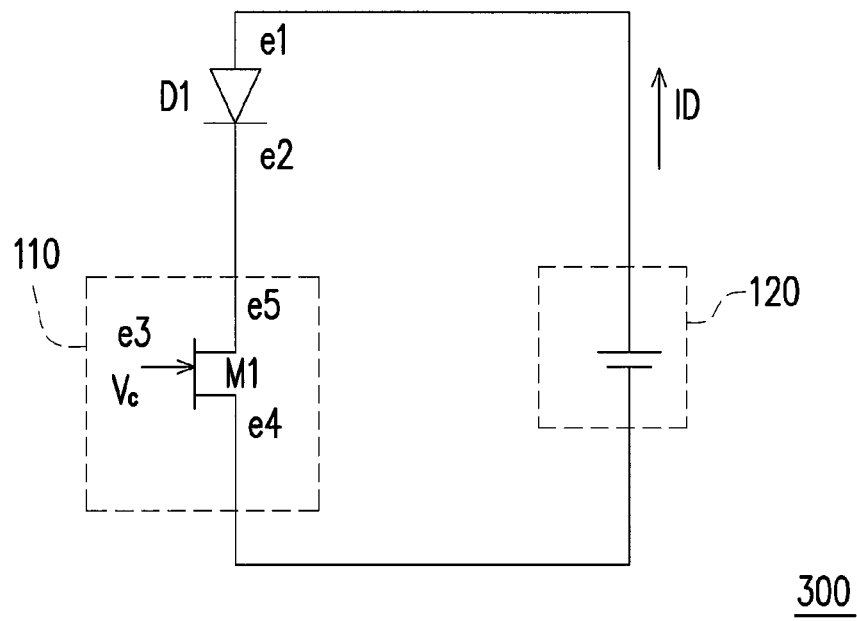
FIG. 3B is another schematic diagram of a light emitting device 300 according to an embodiment of the present invention.

FIG. 3B is another schematic diagram of the light emitting device 300 according to an embodiment of the present invention. The light emitting device 300 includes the current stabilizing unit 110, the power source 120, and the diode D1. The present embodiment is substantially the same as the embodiment of FIG. 3A. The difference from the embodiment of FIG. 3A is that the current is mainly controlled by a control voltage Vc individually received by the gate electrode e3 when the transistor M1 enters the saturation region.

Figure 4:
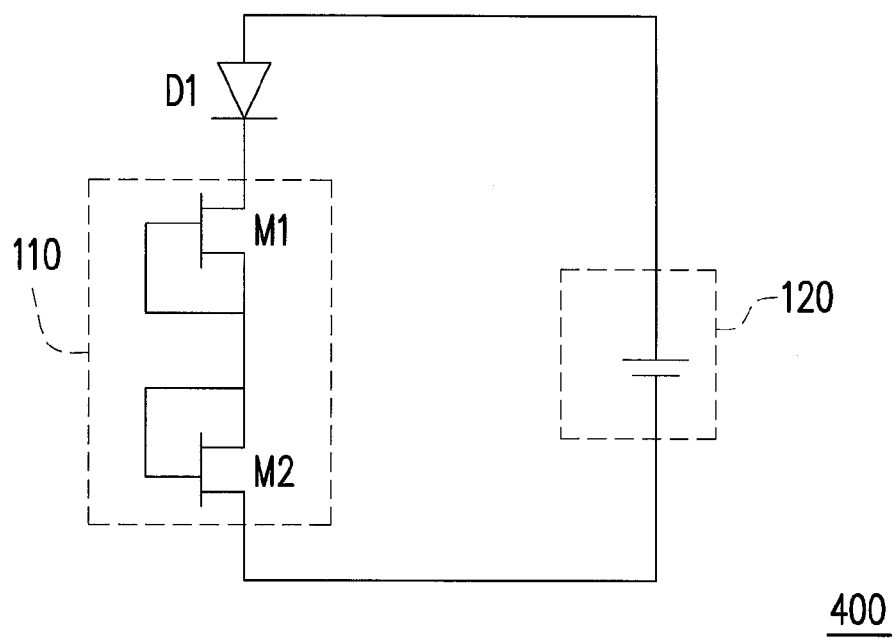
FIG. 4 is a schematic diagram of a light emitting device 400 according to an embodiment of the present invention.

FIG. 4 is a schematic diagram of a light emitting device 400 according to an embodiment of the present invention. Referring to FIG. 4, the light emitting device 400 includes the current stabilizing unit 110, the power source 120, and the diode D1. Compared to the embodiment of FIG. 3A, the current stabilizing unit 110 of the light emitting device 400 in the present invention further includes a transistor M2 electrically connecting the transistor M1 and the power source 120. A drain electrode of the transistor M2 is coupled to a source electrode of the transistor M1, and a gate electrode of the transistor M2 is coupled to the drain electrode of the transistor M2 so as to become an equivalent Schottky diode, wherein the source electrode of the transistor M2 is coupled to the second terminal of the direct-current power source 120. The ability of the light emitting device 400 to withstand electrostatic discharge (ESD) is enhanced by adding the transistor M2 in the current stabilizing unit 110.

By the way, the transistor M2 may be the same as the MESFET or HEMT of the transistor M1 and formed on the growth substrate 10 as illustrated in the embodiment of FIG. 1.

Figure 5:
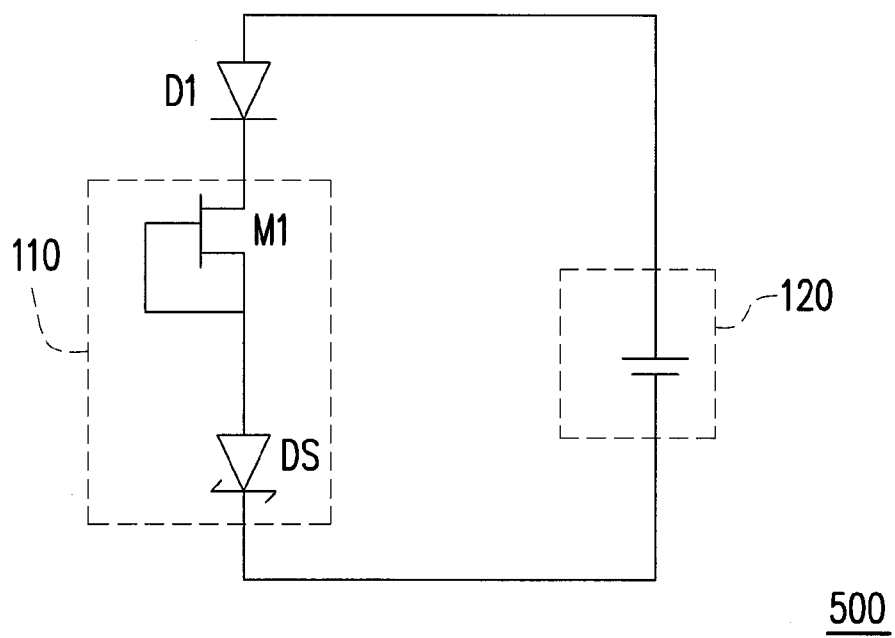
FIG. 5 is a schematic diagram of a light emitting device 500 according to an embodiment of the present invention.

FIG. 5 is a schematic diagram of a light emitting device 500 according to an embodiment of the present invention. Referring to FIG. 5, the light emitting device 500 includes the current stabilizing unit 110, the direct-current power source 120, and the diode D1. The present embodiment is substantially the same as the embodiment of FIG. 4. The difference is that the transistor M2 within the current stabilizing unit 110 in the embodiment of FIG. 4 may also be replaced by a Schottky diode DS in the present embodiment, wherein an anode electrode of the Schottky diode DS is coupled to the source electrode of the transistor M1 and a cathode electrode of the Schottky diode DS is coupled to the second terminal of the power source 120.

Figure 6:
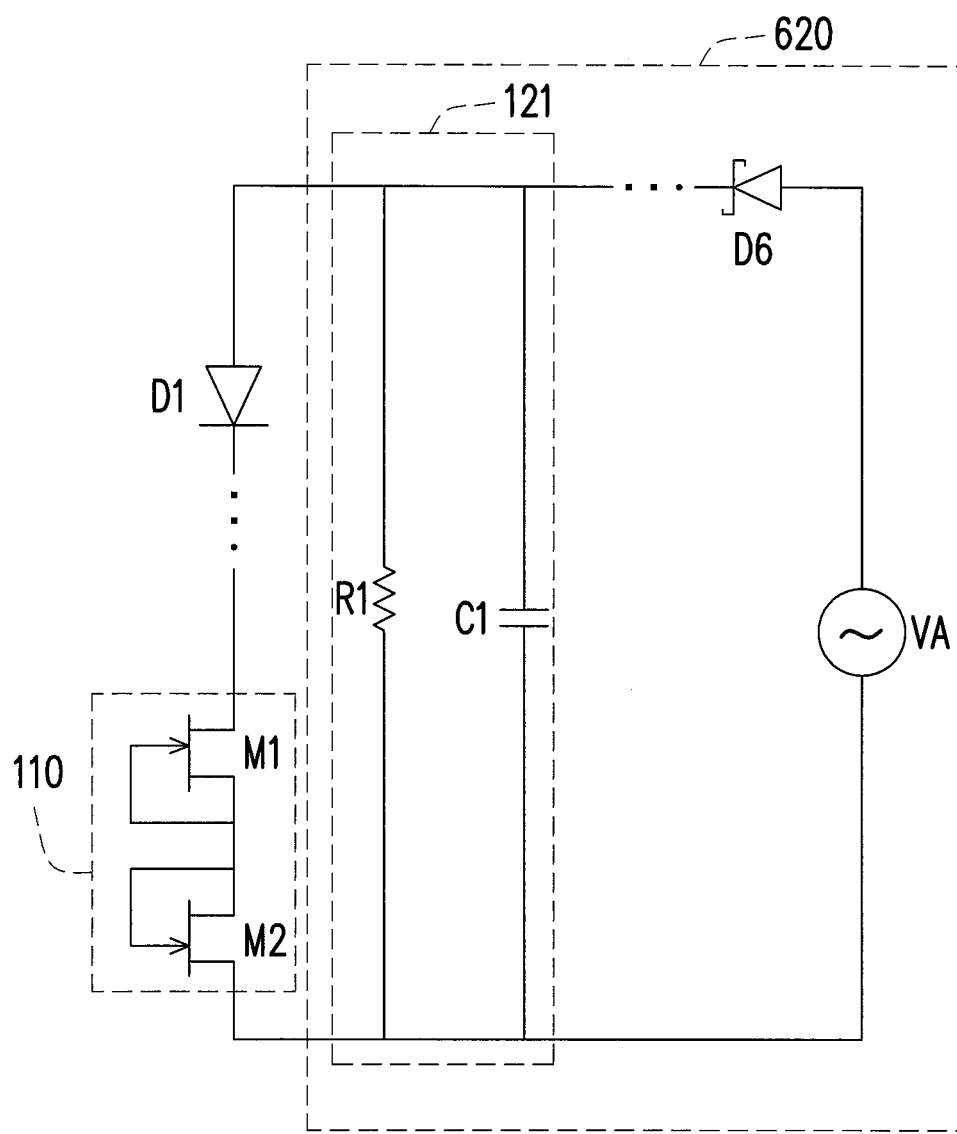
FIG. 6 is a schematic diagram of a light emitting device 600 according to an embodiment of the present invention.

FIG. 6 is a schematic diagram of a light emitting device 600 according to an embodiment of the present invention. Referring to FIG. 6, the light-emitting device 600 includes the current stabilizing unit 110, a half-wave rectifying voltage source 620 and at least one diode D1. The half-wave rectifying voltage source 620 forms a direct-current power source by an alternating-current power source VA, at least one diode D6 and a voltage drop delay circuit 121, wherein the diode D6 electrically connects a first terminal of the alternating-current power source VA and the voltage drop delay circuit 121. To be more specific, the voltage drop delay circuit 121 includes a capacitor C1 and a resistor R1. Both the capacitor C1 and the resistor R1 electrically connect a cathode of the diode D6 and a second terminal of the alternating-current power source VA. In an embodiment of the present invention, the at least one diode D6 may be, for example, a plurality of serially connected Schottky diodes and form a half-wave peak rectifying circuit via the electrical connection between the diode D6 and the voltage drop delay circuit 121 so as to provide a direct-current power source to the diode D1.

Figure 7A:
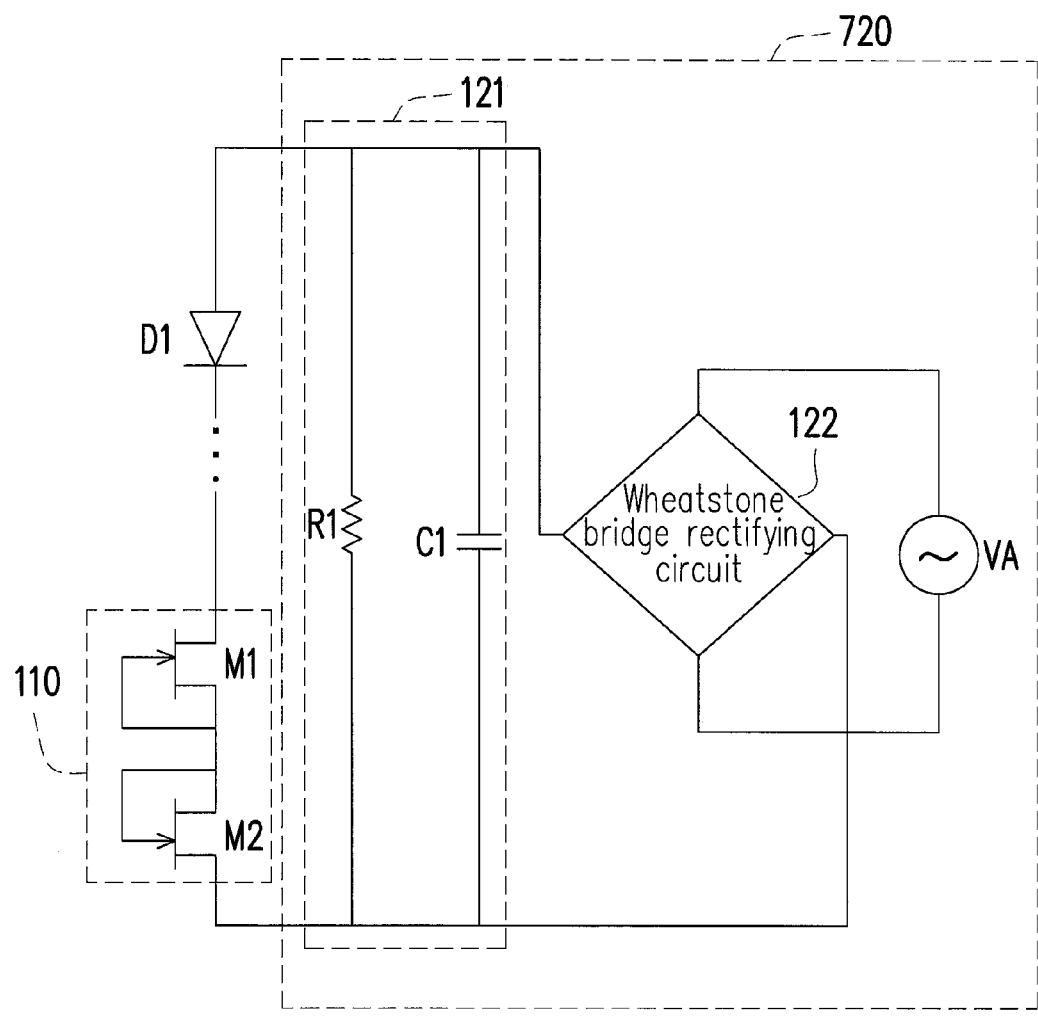
FIG. 7A is a schematic diagram of a light emitting device 700 according to an embodiment of the present invention.

FIG. 7A is a schematic diagram of a light emitting device 700 according to an embodiment of the present invention. Referring to FIG. 7A, the light emitting device 700 includes the current stabilizing unit 110, a full-wave rectifying voltage source 720 and at least one diode D1. The full-wave rectifying voltage source 720 of the light emitting device 700, like the half-wave rectifying voltage source 620 in the embodiment of FIG. 6, also provides a direct-current power source to the diode D1. The difference is that the full-wave rectifying voltage source 720 of the light emitting device 700 in the present embodiment may be achieved by electrically connecting a Wheatstone bridge rectifying circuit 122 and the voltage drop delay circuit 121, wherein the input terminals of the Wheatstone bridge rectifying circuit 122 are coupled to both terminals of the alternating-current power source VA and the voltage drop delay circuit 121 is coupled to the output terminals of the Wheatstone bridge rectifying circuit 122. Moreover, the voltage drop delay circuit 121 includes the capacitor C1 and the resistor R1, wherein the capacitor C1 and the resistor R1 electrically connect the output terminals of the Wheatstone bridge rectifying circuit 122.

Figure 7B:
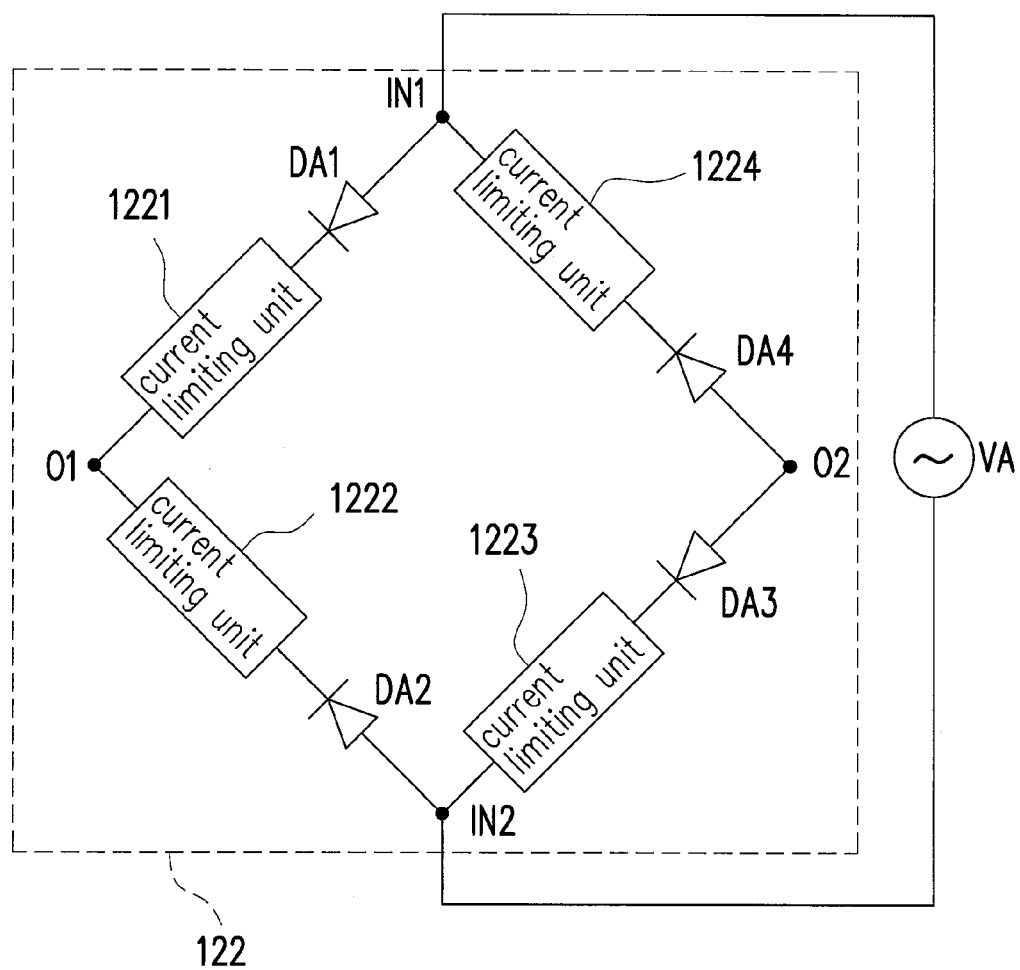
FIG. 7B is a schematic diagram of the Wheatstone bridge rectifying circuit 122 of the embodiment in FIG. 7A.

FIG. 7B is a schematic diagram of the Wheatstone bridge rectifying circuit 122 of the embodiment in FIG. 7A. Referring to FIG. 7B, the Wheatstone bridge rectifying circuit 122 includes a rectifying diode DA1, a rectifying diode DA2, a rectifying diode DA3, and a rectifying diode DA4, and also includes a current stabilizing unit 1221, a current stabilizing unit 1222, a current stabilizing unit 1223, and a current stabilizing unit 1224. The rectifying diodes DA1~DA4 may be light emitting diodes or Schottky diodes. The current stabilizing units 1221~1224 may adjust the currents passing through the rectifying diodes DA1~DA4, wherein the current stabilizing units 1221~1224 are the same as the current stabilizing unit 110 in the embodiments of FIG. 3A, FIG. 3B, FIG. 4, or FIG. 5.

In more detail, an anode of the rectifying diode DA1 is coupled to an input terminal IN1 of the Wheatstone bridge rectifying circuit 122 (i.e. the first terminal of the alternating-current power source VA), and the current stabilizing unit 1221 electrically connects a cathode of the rectifying diode D1 and an output terminal O1 of the Wheatstone bridge rectifying circuit 122. An anode of the rectifying diode DA2 is coupled to a second input terminal IN2 of the Wheatstone bridge rectifying circuit 122 (i.e. the second terminal of the alternating-current power source VA), and the current stabilizing unit 1222 electrically connects a cathode of the rectifying diode DA2 and the output terminal O1 of the Wheatstone bridge rectifying circuit 122. An anode of the rectifying diode DA3 is coupled to an output terminal O2 of the Wheatstone bridge rectifying circuit 122, and the current stabilizing unit 1223 electrically connects a cathode of the rectifying diode DA3 and the input terminal IN2 of the Wheatstone bridge rectifying circuit 122. An anode of the current stabilizing diode DA4 is coupled to the output terminal O2 of the Wheatstone bridge rectifying circuit 122, and the current stabilizing unit 1224 electrically connects a cathode of the rectifying diode DA4 and the input terminal IN1 of the Wheatstone bridge rectifying circuit 122.

It is noted that the resistor R1, the capacitor C1 and the diode D6 in the embodiment of FIG. 6 and those in the embodiment of FIG. 7A may all be formed on the growth substrate 10 as in the embodiment of FIG. 1. However, when the capacitor C1 is applied, the capacitance thereof normally needs a wider range for adjustment. Therefore, the capacitor C1 may also be achieved via a capacitor outside of the growth substrate 10 so that a capacitance of the capacitor C1 is not limited by a manufacturing process. Moreover, the diode D6 and the diode in the Wheatstone bridge rectifying circuit 122 may be achieved via MESFETs or HEMTs the same as the transistor M1 in the embodiment of FIG. 1, wherein a gate electrode of the semiconductor field effect transistor is coupled to a drain electrode thereof to form an anode of the diode, and wherein a source electrode of the semiconductor field effect transistor forms a cathode of the diode. Furthermore, as illustrated in FIG. 7B, the rectifying diodes DA1~DA4 in the Wheatstone bridge rectifying circuit 122 may be light emitting diodes or Schottky diodes formed on the growth substrate 10.

Figure 8:
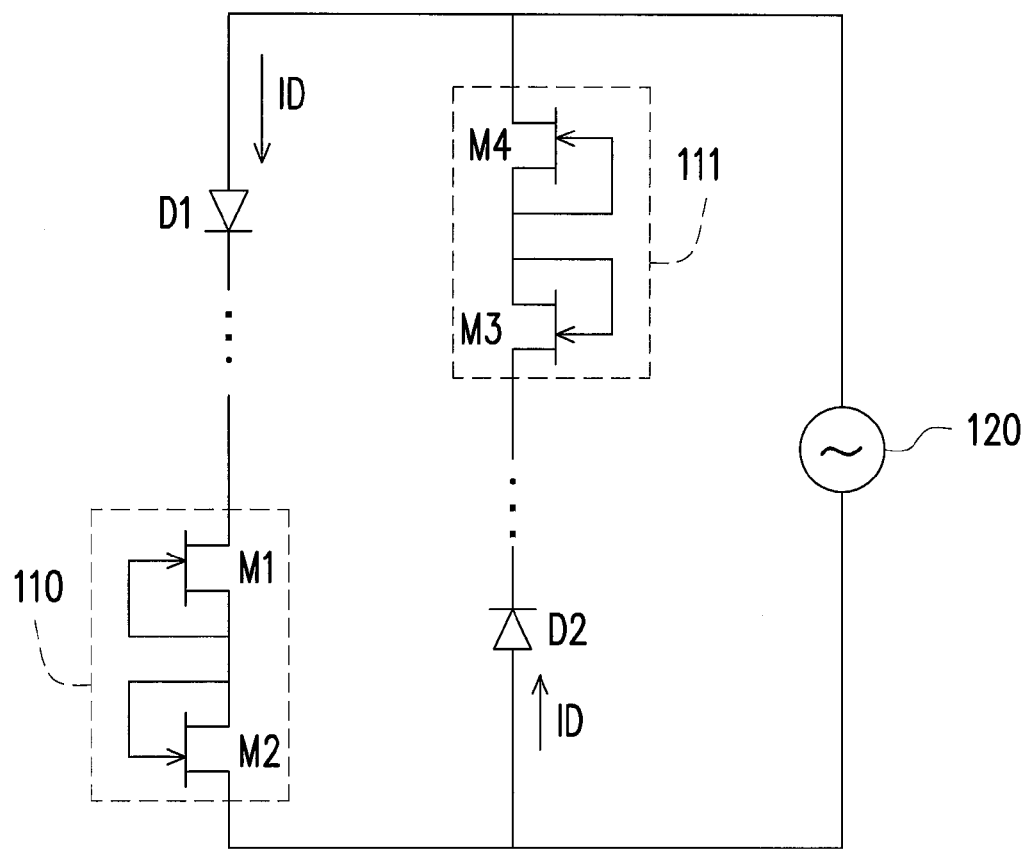
FIG. 8 is a schematic diagram of a light emitting device 800 according to an embodiment of the present invention.

FIG. 8 is a schematic diagram of a light emitting device 800 according to an embodiment of the present invention. Referring to FIG. 8, the light emitting device 800 includes the current stabilizing unit 110, a current stabilizing unit 111, the power source 120, at least one diode D1, and at least one diode D2. In the present embodiment of the present invention, the current stabilizing unit 110 may include the transistors M1 and M2, and the current stabilizing unit 111 may include transistors M3 and M4. Moreover, the transistors M1, M2, M3, and M4 may have the same structure as the MESFET or HEMT in the embodiment of FIG. 1 and may be formed on a growth substrate. The drain electrodes of the transistors M1 and M3 are respectively coupled to the cathodes of the diodes D1 and D2, and the source electrodes of the transistor M2 and M4 are respectively coupled to the second terminal and the first terminal of the power source 120. The gate electrodes of the transistors M1 and M3 are respectively coupled to the source electrodes of the transistors M1 and M3, the drain electrodes of the transistors M2 and M4 are respectively coupled to the source electrodes of the transistors M1 and M3, and the gate electrodes of the transistors M2 and M4 are respectively coupled to the drain electrodes of the transistors M2 and M4. Additionally, both the diodes D1 and D2 may be light emitting diodes and formed on the growth substrate 10 as in the embodiment of FIG. 1.

In the present embodiment, the power source 120 is an alternating-current power source. At a positive voltage half-period of the power source 120, a path of the current ID starts from the first terminal of the power source 120, passes through the diode D1 and the current stabilizing unit 110, and ends at the second terminal of the power source 120. Meanwhile, if the diode D1 is a light emitting diode, it may emit light due to the passage of the current ID. On the other hand, at a negative voltage half-period of the power source 120, a path of the current ID starts from the second terminal of the power source 120, passes through the diode D2 and the current stabilizing unit 111, and ends at the first terminal of the power source 120. Meanwhile, if the diode D2 is a light emitting diode, it may emit light due to the passage of the current ID.

Figure 9:
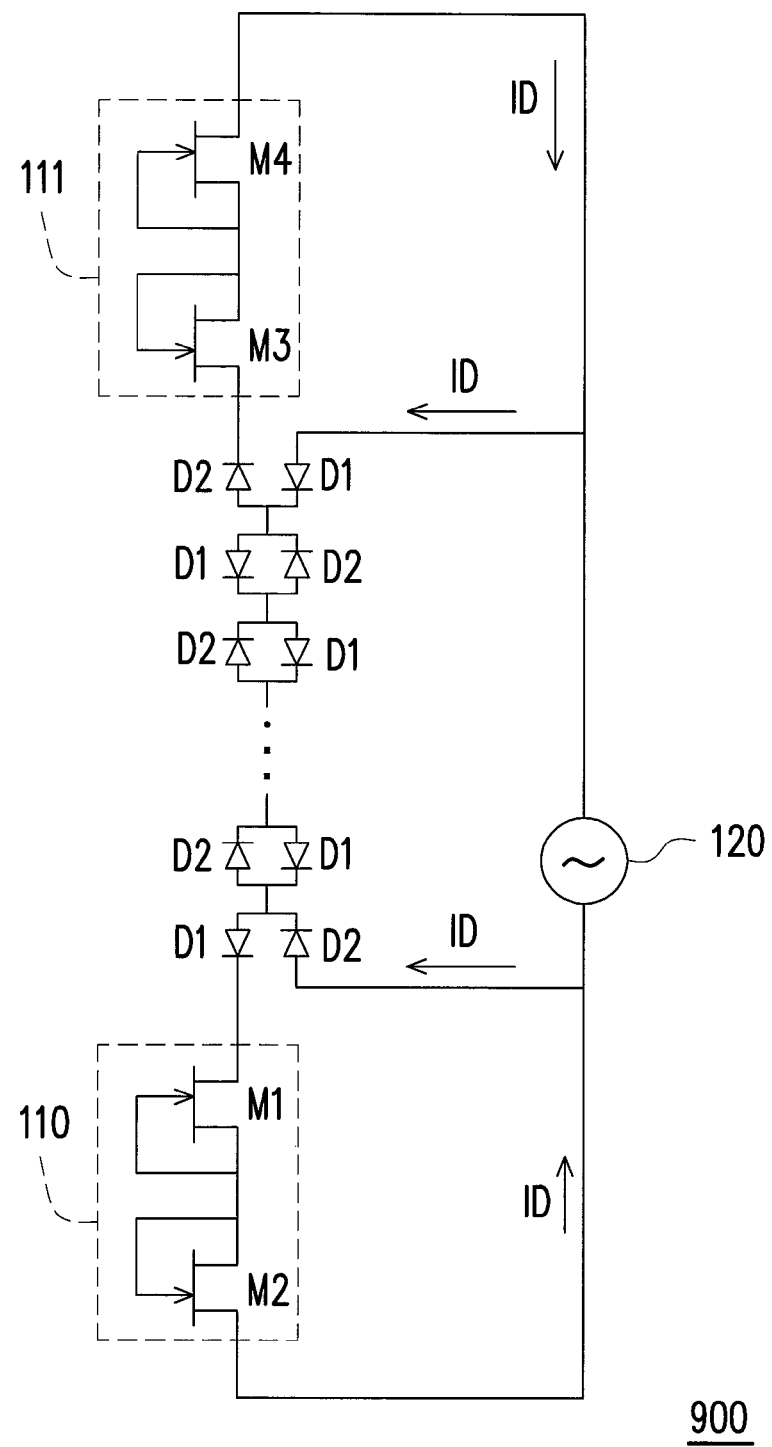
FIG. 9 is a schematic diagram of a light emitting device 900 according to an embodiment of the present invention.

FIG. 9 is a schematic diagram of a light emitting device 900 according to an embodiment of the present invention. Referring to FIG. 9, the light emitting device 900 includes the current stabilizing unit 110, the current stabilizing unit 111, the power source 120, at least one diode D1 and at least one diode D2. The light emitting device 900 is similar to that in the embodiment of FIG. 8. The difference from the embodiment of FIG. 8 is that the anode of the diode D1 of the light emitting device 900 is coupled to the cathode of the diode D2, and the cathode of the diode D1 is coupled to the anode of the diode D2. By that means, formation positions of the diode D1 and diode D2 may be more flexible in terms of physical arrangements. For example, as illustrated in FIG. 9, the aforementioned at least one diode D1 and at least one diode D2 are a plurality of diodes D1 and a plurality of diodes D2, wherein the plurality of diodes D1 and D2 are all light emitting diodes, which may be arranged alternately in pairs. Therefore, no matter the alternating-current power source 120 is at the positive voltage half-period or at the negative voltage half-period, although the diodes D1 and the diodes D2 emit by turns, since the diodes D1 and the diodes D2 are closely interwoven, the effect of a more concentrated and continuous light source may be simulated.

Figure 10:
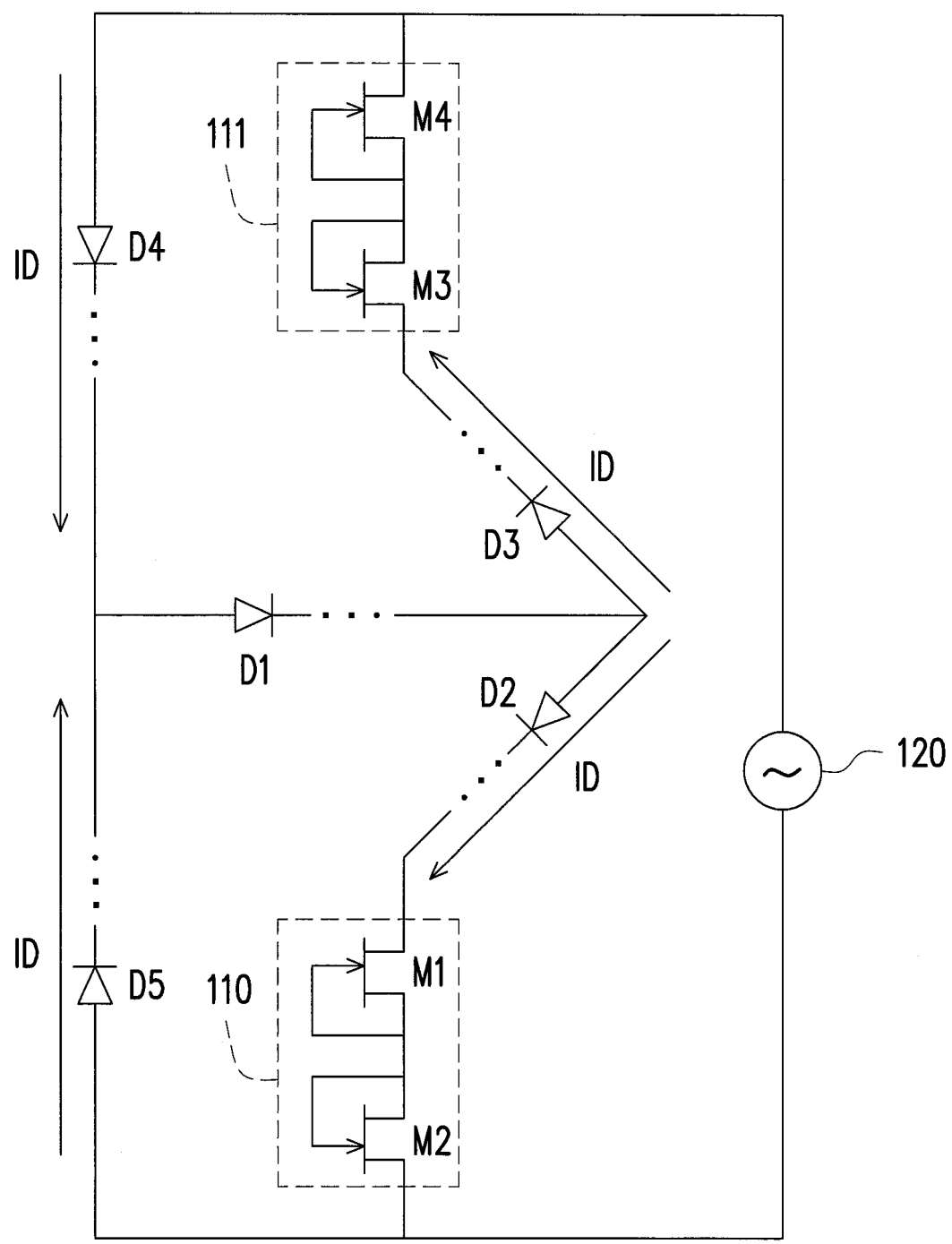
FIG. 10 is a schematic diagram of a light emitting device 1000 according to an embodiment of the present invention.

FIG. 10 is a schematic diagram of a light emitting device 1000 according to an embodiment of the present invention. Referring to FIG. 10, the light emitting device 1000 includes the current stabilizing units 110 and 111, the power source 120, at least one diode D1 and D2, and at least one diode D3, D4, and D5. The present embodiment may also refer to the embodiment of FIG. 8, in which same reference numbers represent same or like elements. The current stabilizing unit 100 may include the transistors M1 and M2, and the current stabilizing unit 111 may include the transistors M3 and M4. The gate electrodes of the transistors M1 and M3 are respectively coupled to the source electrodes of the transistors M1 and M3; the drain electrodes of the transistors M2 and M4 are respectively coupled to the source electrodes of the transistors M1 and M3; the gate electrodes of the transistors M2 and M4 are respectively coupled to the drain electrodes of the transistors M2 and M4.

To be more specific, the anode of the diode D2 is coupled to the cathode of the diode D1, and the cathode of the diode D2 is coupled to the drain electrode of the transistor M1. An anode of the diode D3 is coupled to the cathode of the diode D1, and a cathode of the diode D3 is coupled to the drain electrode of the transistor M3. An anode of the diode D4 is coupled to the first terminal of the power source 120, and a cathode of the diode D4 is coupled to the anode of the diode D1. Moreover, an anode of the diode D5 is coupled to the second terminal of the power source 120, and a cathode of the diode D5 is coupled to the anode of the diode D1.

In an embodiment of the present invention, the diode D1 is a light emitting diode, and the diodes D2, D3, D4, and D5 may be light emitting diodes or Schottky diodes and formed on a growth substrate as illustrated in the embodiment of FIG. 1. In the present embodiment, the power source 120 is an alternating-current power source. When the power source 120 is at the positive voltage half-period, a path of the current ID is formed starting from the first terminal of the power source 120, passing through the diodes D4, D1, and D2, then passing through the current stabilizing unit 110, and ending at the second terminal of the power source 120. Similarly, when the power source 120 is at the negative voltage half-period, another path of the current ID is formed starting from the second terminal of the power source 120, passing through the diodes D5, D1, and D3, then passing through the current stabilizing unit 111, and ending at the first terminal of the power source 120. The light emitting device 1000 may be adapted to high voltages since there exist multiple groups of diodes along the paths of current in the present embodiment.

Figure 11:
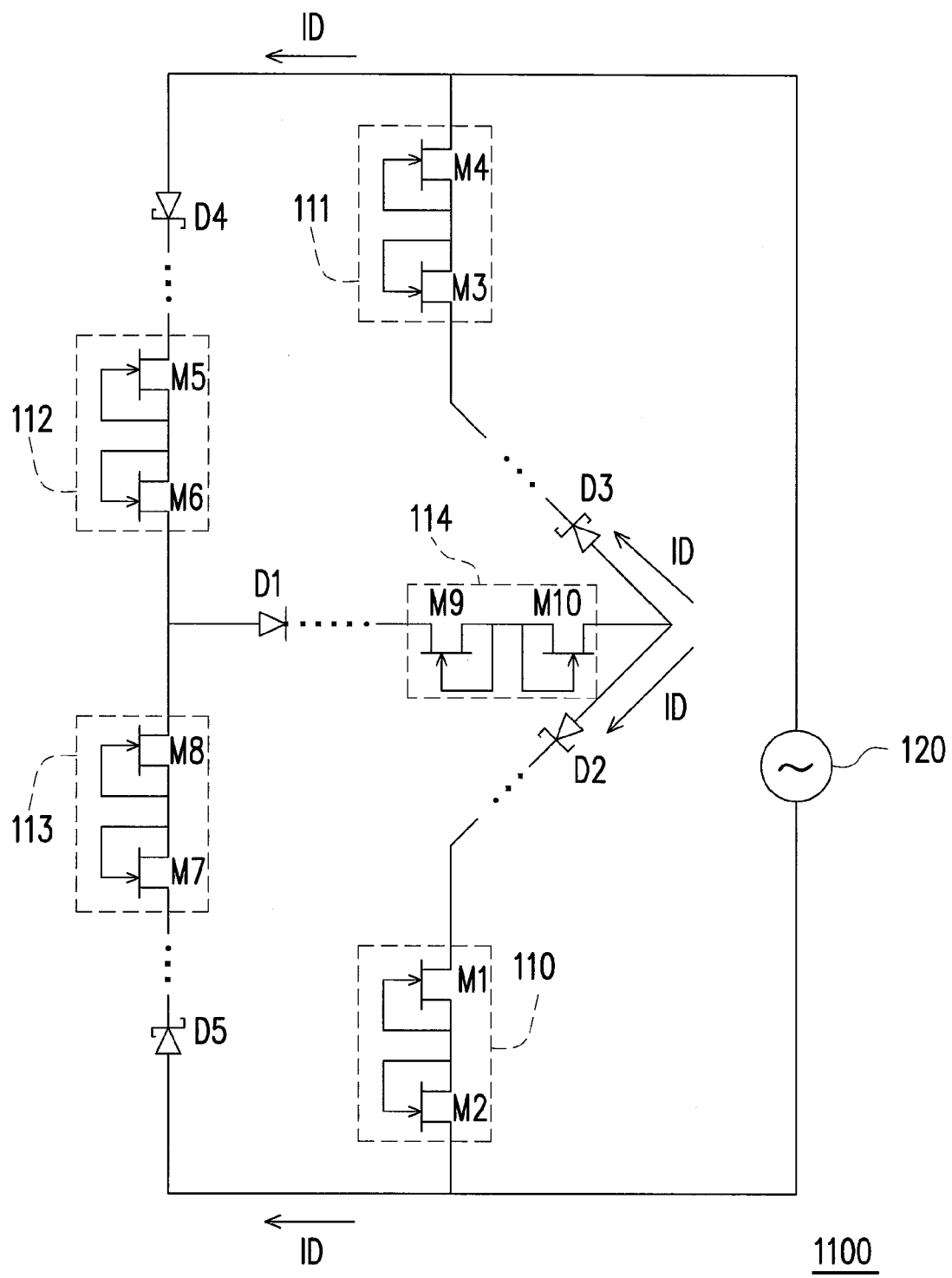
FIG. 11 is a schematic diagram of a light emitting device 1100 according to an embodiment of the present invention.

FIG. 11 is a schematic diagram of a light emitting device 1100 according to an embodiment of the present invention. Referring to FIG. 11, the light emitting device 1100 includes the current stabilizing units 110 and 111, current stabilizing units 112, 113, and 114, a power source 120, and at least one diode D1, D2, D3, D4, and D5. The light emitting device 1100 is similar to that in the embodiment of FIG. 10, in which same reference numbers represent same or like elements. The difference from the embodiment of FIG. 10 is that the light emitting device 1100 further includes the current stabilizing units 112, 113, and 114. The current stabilizing unit 112 electrically connects the diode D4 and the diode D1, and the current stabilizing unit 114 electrically connects the diode D1 and the diode D2.

To be more specific, the current stabilizing units 112, 113, and 114 respectively include transistors M5, M7, and M9. Drain electrodes of the transistors M5 and M7 are respectively coupled to the cathodes of the diode D4 and the diode D5, and a drain electrode of the transistor M9 is coupled to the cathode of the diode D1. Additionally, the current stabilizing units 112, 113, and 114 may respectively include transistors M6, M8, and M10. Source electrodes of the transistors M6 and M8 are jointly coupled to the anode of the diode D1, and a source electrode of the transistor M10 is coupled to the anodes of the diodes D2 and D3. Similar to the current stabilizing unit 110 in the embodiment of FIG. 4, gate electrodes of the transistors M5, M7, and M9 are individually coupled to source electrodes of the transistors M5, M7, and M9. Drain electrodes of the transistors M6, M8, and M10 are respectively coupled to the source electrodes of the transistors M5, M7, and M9. Gate electrodes of the transistors M6, M8, and M10 are respectively coupled to the drain electrodes of the transistors M6, M8, and M10.

In the present embodiment, the diode D1 is a light emitting diode, and the diodes D2~D5 may be Schottky diodes. By that means, the light emitting device 110 may not only be adapted to high voltages, but the emitting position may also focus on a region in which the diode D1 is disposed. Moreover, the diodes D2~D5 may be formed by the MESFET or HEMT M1 as in the embodiment of FIG. 1, the method of formation thereof has been explained in the embodiments of FIG. 6 and FIG. 7A and will not be repeated hereinafter.

By the way, the transistors M2~M4 in the embodiments of FIG. 8, FIG. 9, and FIG. 10 and the transistors M2~M10 in the embodiment of FIG. 11 may all be MESFETs or HEMTs as the transistor M1 in the embodiment of FIG. 1 and formed on the growth substrate. Moreover, the transistors M2 and M4 in the embodiments of FIG. 8, FIG. 9, and FIG. 10 and the transistors M2, M4, M6, M8, and M10 in the embodiment of FIG. 11 may be replaced by Schottky diodes, wherein coupling relations thereof are similar to the description related to Schottky diodes in the embodiment of FIG. 5, and will not be repeated hereinafter.

Additionally, the transistors M1 and M3 of the current stabilizing units 110 and 111 in the embodiments of FIG. 8, FIG. 9, and FIG. 10, and the transistors M1, M3, M5, M7, and M9 of the current stabilizing units 112~114 in the embodiment of FIG. 11 may be the same as those in the embodiment in FIG. 3B, wherein the current passing through the light emitting diodes of the light emitting device is controlled by the control voltage received by the gate electrodes. Additionally, the current stabilizing units 110~114 in each of the aforementioned embodiments may depend on necessity of practical application, wherein the number of the transistors M1, M3, M5, M7, and M9 may be only one or may be plural in other embodiments.

Moreover, the current stabilizing units 110~114 in each of the aforementioned embodiments may also depend on necessity of practical application, wherein the transistors M2, M4, M6, M8, and M10 used to withstand electrostatic discharge may not be provided in other embodiments, or pluralities of the transistors M2, M4, M6, M8, and M10 may be provided in the current stabilizing units 110~414 in other embodiments.

To sum up, a light emitting component including a light emitting diode and a MESFET or HEMT formed on a same growth substrate is provided in the present invention. A light emitting device including a light emitting diode and a current stabilizing unit is also provided in the present invention, wherein the current stabilizing unit includes the aforementioned semiconductor field effect transistor. A current passing through the light emitting diode may be limited by controlling a gate voltage of the semiconductor field effect transistor or coupling the gate electrode of the semiconductor field effect transistor to a source electrode thereof so as to prevent the light emitting diode from lifetime shortening due to overheating so that the cost needed due to radiating of the light emitting device may be reduced. Additionally, elements of a direct-current power source may be integrated on the growth substrate of the light emitting component in the present invention so that the cost for manufacturing light emitting devices may further be saved.

The Second Embodiment

Figure 12:
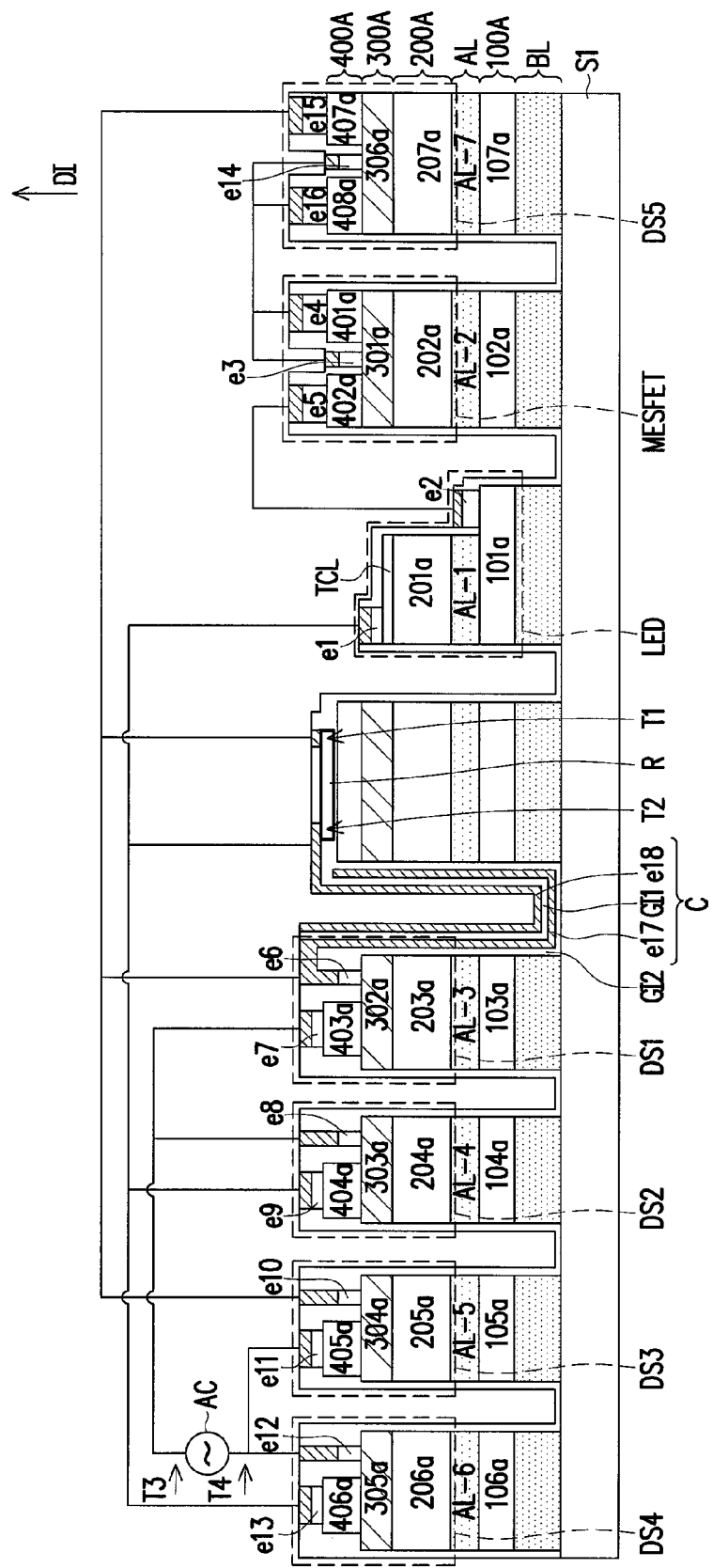
FIG. 12 is a schematic diagram of a light emitting device 2000 according to an embodiment of the present invention.

FIG. 12 is a schematic diagram of a light emitting device according to an embodiment of the present invention. Referring to FIG. 12, a light emitting device 2000 in the present embodiment includes a growth substrate S1, a first type semiconductor layer 100A, an active layer AL formed on top of the first type semiconductor layer 100A, a second type semiconductor layer 200A formed on top of the active layer AL, a third type semiconductor layer 300A formed on top of the second type semiconductor layer 200A, and a fourth type semiconductor layer 400A formed on top of the third type semiconductor layer 300A. In the present embodiment, the growth substrate S1 may be a sapphire substrate, GaN substrate or Si substrate for example, and yet the present invention is not limited thereto. In the present embodiment, materials of the first type semiconductor layer 100A, the second type semiconductor layer 200A, the third type semiconductor layer 300A, and the fourth type semiconductor layer 400A may respectively be an n-type, a p-type, an n-type, and an n-type III-nitride, and yet the present invention is not limited thereto. The n-type III-nitride is, for example, an n-type gallium nitride (n-GaN), an n-type aluminum gallium nitride (n-AlGaN), or a n-type indium gallium nitride (n-InGaN). The p-type III-nitride is, for example, a p-type gallium nitride (p-GaN), a p-type aluminum gallium nitride (p-AlGaN), or a p-type indium gallium nitride (p-InGaN). The active layer AL may include multiple quantum wells. In other words, the active layer AL is a light emitting layer, which may emit light when being enabled. Moreover, a doping concentration of the fourth type semiconductor layer 400A may be greater than that of the third type semiconductor layer 300A in the present embodiment. Additionally, the light emitting component 2000 may further include a buffer layer BL formed between the growth substrate S1 and the first type semiconductor layer 100A, wherein a material of the buffer layer BL may be aluminum nitride, and yet the present invention is not limited thereto.

In the present embodiment, as shown in FIG. 12, a first semiconductor region 101a and a third semiconductor region 102a are separated from the first type semiconductor layer 100A; a first active region AL-1 and a second active region AL-2 are separated from the active layer AL; a second semiconductor region 201a and a first base region 202a are separated from the second type semiconductor layer 200A; a channel semiconductor region 301a is separated from the third type semiconductor layer 300A; a source semiconductor region 401a and a drain semiconductor region 402a are separated from the fourth semiconductor 400A. The active region AL-1 and the second semiconductor region 201a expose a portion of the first semiconductor region 101a. The source semiconductor region 401a and the drain semiconductor region 402a are respectively positioned on two opposite sides on top of the channel semiconductor region 301a and expose a portion of the channel semiconductor region 301a. The first semiconductor region 101a, the first active region AL-1, the second semiconductor region 201a, a transparent conductive layer (TCL), an electrode e1, and an electrode e2 may overlap in a direction DI vertically departing from the growth substrate S1 to constitute a light emitting diode. The electrode e1 may electrically connect the second semiconductor region 201 via the transparent conductive layer (TCL), and the electrode e2 may electrically connect the first semiconductor region 101a. The first base region 202a, the channel semiconductor region 301a, the source semiconductor region 401a, the drain semiconductor region 402a, a gate electrode e3, a source electrode e4, and a drain electrode e5 may overlap in the direction DI vertically departing from the growth substrate S1 to constitute a semiconductor field effect transistor, MESFET or HEMT for example. The third semiconductor region 102a and the second active region AL-2 overlap with the semiconductor field effect transistor. The gate electrode e3 may form a Schottky contact with the channel semiconductor region 301a exposed by the source semiconductor region 401a and the drain semiconductor region 402a. The source electrode e4 and the drain electrode e5 may respectively form ohmic contacts with the source semiconductor region 401a and the drain semiconductor region 402a. When the first base region 202a and the channel semiconductor region 301a are of opposite conductivity types, a depletion region formed in between may electrically isolate the semiconductor field effect transistor from each element below such as the third semiconductor region 102a and the second active region AL-2.

A fourth semiconductor region 103a, a fifth semiconductor region 104a, a sixth semiconductor region 105a, and a seventh semiconductor region 106a may further be separated from the semiconductor layer 100A in the present embodiment. A third active region AL-3, a fourth active region AL-4, a fifth active region AL-5, and a sixth active region AL-6 may further be separated from the active layer AL in the present embodiment. A second base region 203a, a third base region 204a, a fourth base region 205a, and a fifth base region 206a may further be separated from the second type semiconductor layer 200A in the present embodiment. A first anode semiconductor region 302a, a second anode semiconductor region 303a, a third anode semiconductor region 304a, and a fourth anode semiconductor region 305a may further be separated from the third type semiconductor layer 300A in the present embodiment. A first cathode semiconductor region 403a, a second cathode semiconductor region 404a, a third cathode semiconductor region 405a, and a fourth cathode semiconductor region 406a may further be separated from the fourth type semiconductor layer 400A in the present embodiment.

In the present embodiment, the second base region 203a, the first anode semiconductor region 302a, the first cathode semiconductor region 403a, an anode electrode e6, and a cathode electrode e7 may overlap in the direction DI vertically departing from the growth substrate S1 to constitute a first Schottky diode DS1. The fourth semiconductor region 103a and the third active region AL-3 overlap with the first Schottky diode DS1. The anode electrode e6 may form a Schottky contact with the first anode semiconductor region 302a, and the cathode electrode e7 may form an ohmic contact with the first cathode semiconductor region 403a.

In the present embodiment, the third base region 204a, the second anode semiconductor region 303a, the second cathode semiconductor region 404a, an anode electrode e8, and a cathode electrode e9 may overlap in the direction DI vertically departing from the growth substrate S1 to constitute a second Schottky diode DS2. The fifth semiconductor region 104a and the fourth active region AL-4 overlap with the second Schottky diode DS2. The anode electrode e8 may form a Schottky contact with the second anode semiconductor region 303a, and the cathode electrode e9 may form an ohmic contact with the second cathode semiconductor region 404a.

In the present embodiment, the fourth base region 205a, the third anode semiconductor region 304a, the third cathode semiconductor region 405a, an anode electrode e10, and a cathode electrode e11 may overlap in the direction DI vertically departing from the growth substrate S1 to constitute a third Schottky diode DS3. The sixth semiconductor region 105a and the fifth active region AL-5 overlap with the third Schottky diode DS3. The anode electrode e10 may form a Schottky contact with the third anode semiconductor region 304a, and the cathode electrode e11 may form an ohmic contact with the third cathode semiconductor region 405a.

In the present embodiment, the fifth base region 206a, the fourth anode semiconductor region 305a, the fourth cathode semiconductor region 406a, an anode electrode e12, and a cathode electrode e13 may overlap in the direction DI vertically departing from the growth substrate S1 to constitute a fourth Schottky diode DS4. The seventh semiconductor region 106a and the sixth active region AL-6 overlap with the fourth Schottky diode DS4. The anode electrode e12 may form a Schottky contact with the fourth anode semiconductor region 305a, and the cathode electrode e13 may form an ohmic contact with the fourth cathode semiconductor region 406a.

In the present embodiment, materials of the anode electrodes e6, e8, e10, and e12 are selected from any or a combination of tungsten, platinum, gold, nickel, and aluminum such as tungsten (W), platinum-gold (Pt/Au) alloy, and nickel-aluminum (Ni/Al) alloy. Materials of the cathode electrodes e6, e7, e9, e11, and e13 are selected from any or a combination of titanium, aluminum, nickel, and gold such as titanium-aluminum (Ti/Al) alloy and titanium-aluminum-nickel-gold (Ti/Al/Ni/Au) alloy.

In the present embodiment, a semiconductor region 107a may further be selectively separated from the first type semiconductor layer 100A. An active region AL-7 may further be selectively separated from the active layer AL. A base region 207a may further be selectively separated from the second type semiconductor layer 200A. A semiconductor region 306a may further be selectively separated from the third type semiconductor layer 300A. A semiconductor region 407a and a semiconductor region 408a may further be selectively separated from the fourth type semiconductor layer 400A. The semiconductor region 407a and the semiconductor region 408a are respectively positioned on two opposite sides on top of the semiconductor region 306a and expose a portion of the semiconductor region 306a. The base region 207a, the semiconductor region 306a, the semiconductor region 407a, the semiconductor region 408a, and electrodes e14, e15, and e16 may overlap in the direction DI vertically departing from the growth substrate S1 to constitute a fifth Schottky diode DS5, and the semiconductor region 107 and the active semiconductor AL-7 overlap with the fifth Schottky diode DS5. The electrode e14 and the semiconductor region 406a exposed by the semiconductor region 407a and the semiconductor region 408a may form a Schottky contact. The electrode e15 and the electrode e16 may respectively form ohmic contacts with the semiconductor region 407a and the semiconductor region 408a. The electrode e14 may electrically connect the electrode e16.

The light emitting device 2000 in the present embodiment further includes a capacitor C with electrodes e11 and e18, a resistor R with two opposite terminals T1 and T2, and an alternating-current power source AC with two terminals T3 and T4. It is noted that the function of a full-wave peak rectifier may be achieved by using the first Schottky diode DS1, the second Schottky diode DS2, the third Schottky diode DS3, the fourth Schottky diode DS4, the capacitor C, and the resistor R so that the light emitting diode may be driven by the alternating-current power source AC efficiently. The semiconductor field effect transistor may perform a current-limiting function on the light emitting diode so as to protect the light emitting diode. Moreover, the ability to withstand electrostatic discharge may be enhanced by the fifth Schottky diode DS5. Electrical connections among the alternating-current power source AC, the first Schottky diode DS1, the second Schottky diode DS2, the third Schottky diode DS3, the fourth Schottky diode DS4, the capacitor C, the resistor R, the firth Schottky diode DS5, the light emitting diode, and the semiconductor field effect transistor will be illustrated along with FIG. 12 and FIG. 13 hereinafter.

Figure 13:
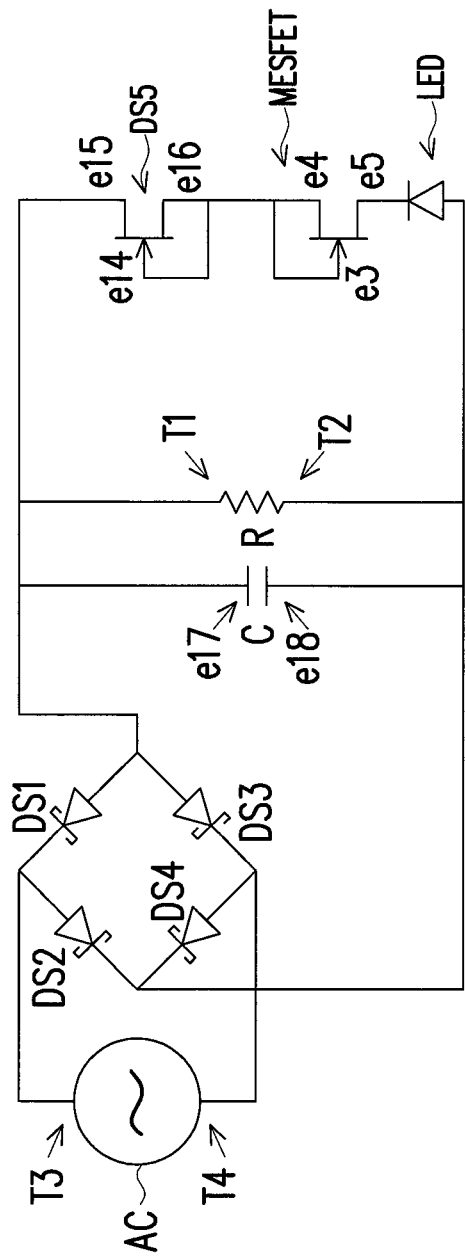
FIG. 13 is an equivalent circuit diagram of the light emitting device 2000 in FIG. 12.

FIG. 13 is an equivalent circuit diagram of the light emitting device 2000 in FIG. 12. Referring to FIG. 12 and FIG. 13, the anode electrode e6 of the first Schottky diode DS1 electrically connects the anode electrode e10 of the third Schottky diode DS3. The cathode electrode e11 of the third Schottky diode DS3 electrically connects the anode electrode e12 of the fourth Schottky diode DS4. The cathode electrode e13 of the fourth Schottky diode DS4 electrically connects the cathode electrode e9 of the second Schottky diode DS2. The anode electrode e8 of the second Schottky diode DS2 electrically connects the cathode electrode e7 of the first Schottky diode DS1. The terminal T3 of the alternating-current power source AC electrically connects the cathode electrode e7 of the first Schottky diode DS1. The terminal T4 of the alternating-current power source AC electrically connects the cathode electrode e11 of the third Schottky diode DS3. The cathode electrode e9 of the second Schottky diode DS2 electrically connects the electrode e1 of the light emitting diode. The electrode e2 of the light emitting diode electrically connects the drain electrode e5 of the semiconductor field effect transistor. The source electrode e4 of the semiconductor field effect transistor electrically connects the gate electrode e3. The source electrode e4 and the gate electrode e3 of the semiconductor field effect transistor electrically connect the electrode e14 and electrode e16 of the fifth Schottky diode DS5. The electrode e15 of the fifth Schottky diode DS5 electrically connects the electrode e17 of the capacitor C. The electrode e17 of the capacitor C electrically connects the terminal T1 of the resistor R. The electrode e17 of the capacitor C electrically connects the anode electrode e6 of the first Schottky diode DS1. The terminal T2 of the resistor R electrically connects the electrode e18 of the capacitor C. The electrode e18 of the capacitor C electrically connects the cathode electrode e13 of the fourth Schottky diode DS4.

From FIG. 12 and FIG. 13, the light emitting device 2000 in the present embodiment may integrate a full-wave peak rectifying circuit (formed by the first Schottky diode DS1, the second Schottky diode DS2, the third Schottky diode DS3, the fourth Schottky diode DS4, the capacitor C, and the resistor R), a current-limiting circuit (formed by the semiconductor field effect transistor), and a circuit to withstand electrostatic discharge (formed by the firth Schottky diode DS5) on the same growth substrate S1.

As illustrated in FIG. 12, in the present embodiment, the resistor R and the capacitor C may be manufactured on the same substrate (i.e. the growth substrate S1) along with the elements such as the MESFET or HEMT and the light emitting diode. To be more specific, the light emitting device 2000 in the present embodiment may further include a first insulating layer GI1 disposed between the electrode e17 and the electrode e18 of the capacitor C. A portion of the first insulating layer GI1 overlapping with the electrode 17 and the electrode 18 may constitute the aforementioned capacitor C therewith. The light emitting device 2000 further includes a second insulating layer GI2, which may be formed on top or on sides of the semiconductor field effect transistor, the first Schottky diode DS1, the second Schottky diode DS2, the third Schottky diode DS3, the fourth Schottky diode DS4, and the fifth Schottky diode DS5. Also, the electrode 17 is formed on top of the second insulating layer GI2. On the other hand, the resistor R in the present embodiment may be formed between the first insulating layer GI1 and the second insulating layer GI2.

Figure 14:
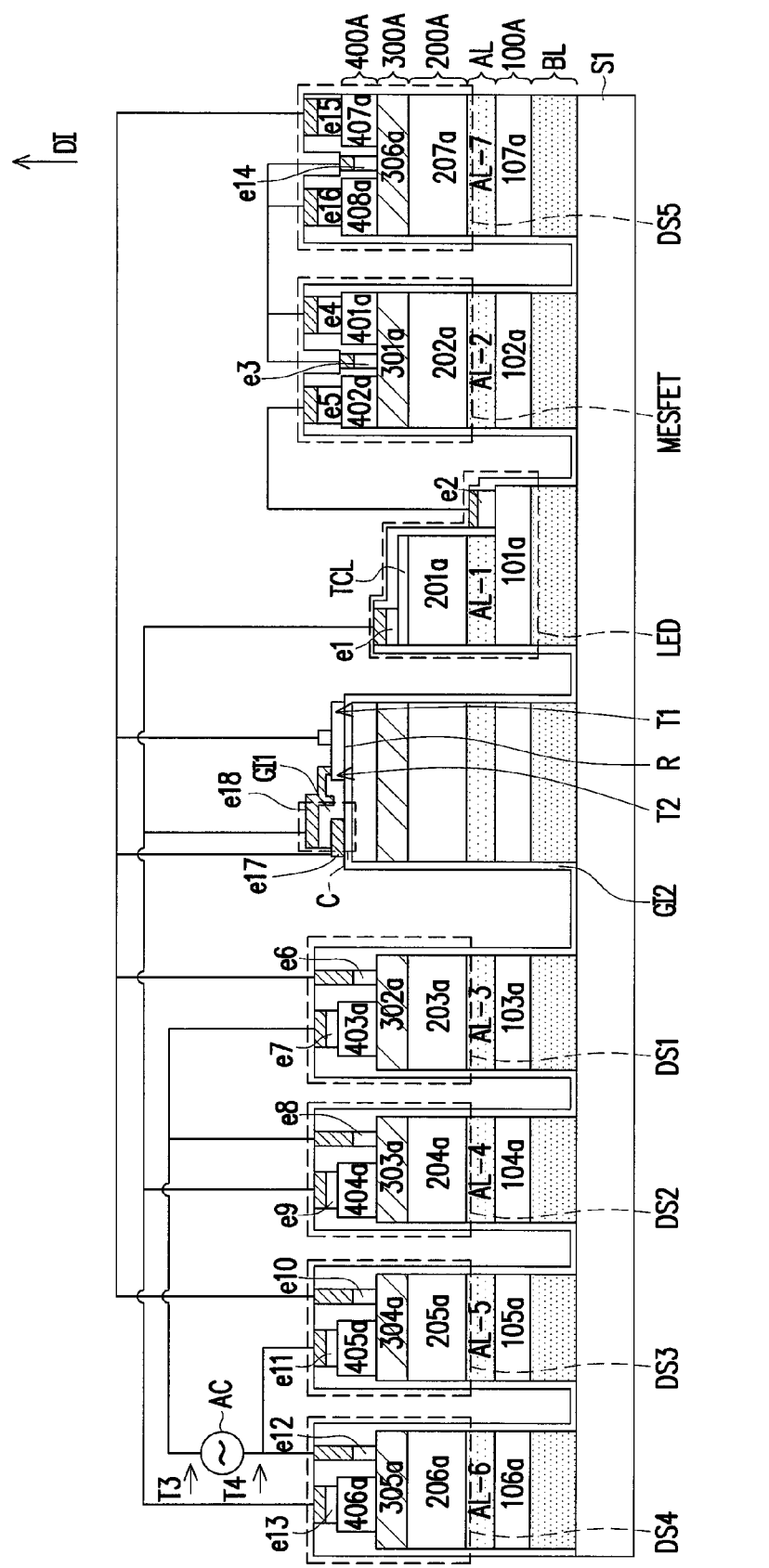
FIG. 14 is another schematic diagram of a light emitting device 2000 according to an embodiment of the present invention.
Figure 15:
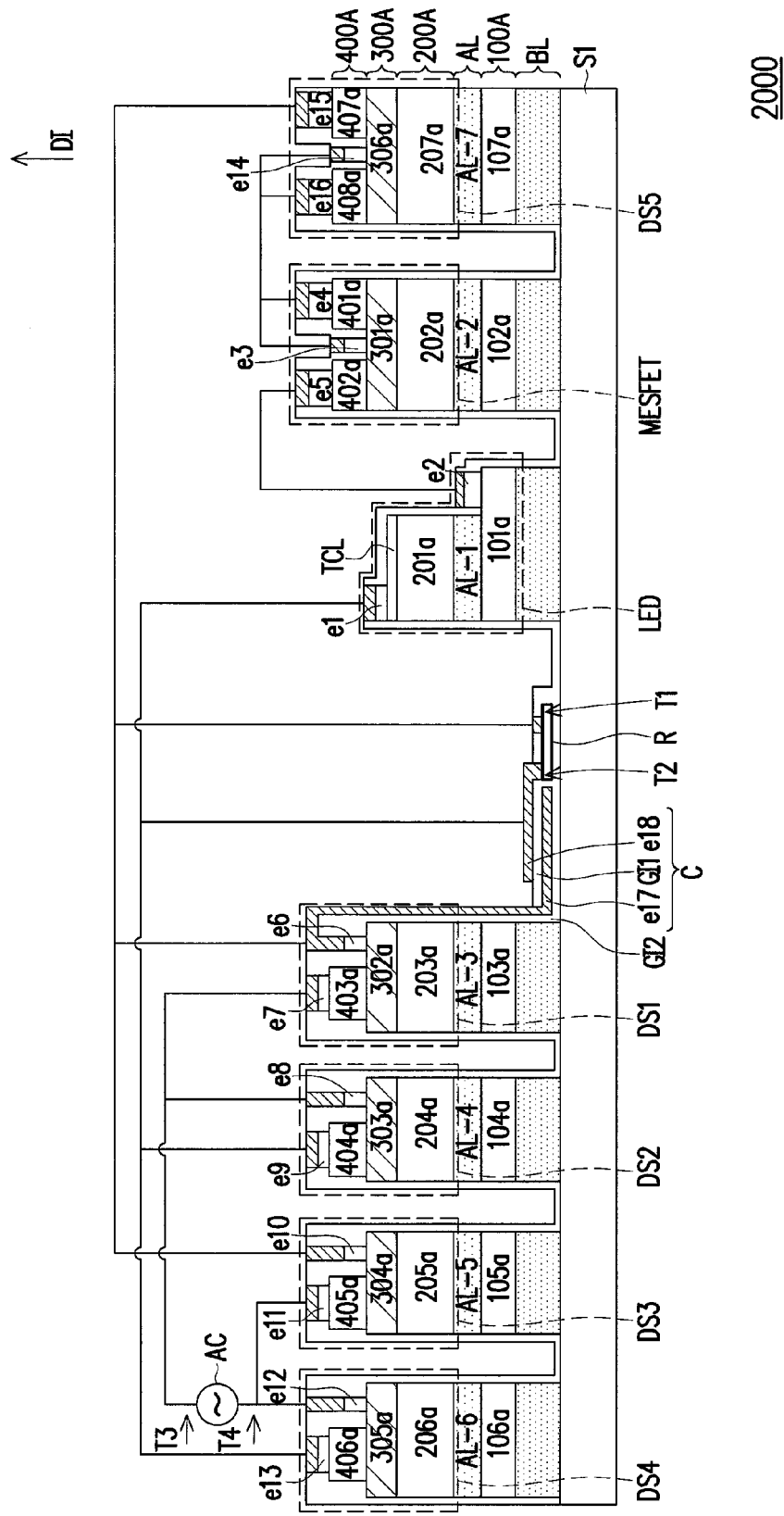
FIG. 15 is still another schematic diagram of a light emitting device 2000 according to an embodiment of the present invention.

However, the formations of the capacitor and the resistor are not limited to the positions described in the previous paragraph. FIG. 14 is a schematic diagram of a light emitting device according to another embodiment of the present invention. In the embodiment of the FIG. 14, the electrode T1 of the resistor R and the electrode e17 of the capacitor C may be jointly formed on a same surface of the fourth type semiconductor layer 400A and the second insulating layer GI2. FIG. 15 is a schematic diagram of a light emitting device according to another embodiment of the present invention. In the embodiment of FIG. 15, the electrode T1 of the resistor R and the electrode e17 of the capacitor C may be jointly formed on a same surface of the growth substrate S1 and the second insulating layer GI2.

Additionally, the capacitor of the present invention may not be formed along with the elements such as the MESFET or HEMT and the light emitting diode on the same substrate. In other words, in other embodiments, the capacitor may connect elements such as the semiconductor field effect transistor and the light emitting diode in an external way, which will be described along with figures hereinafter.

Figure 16:
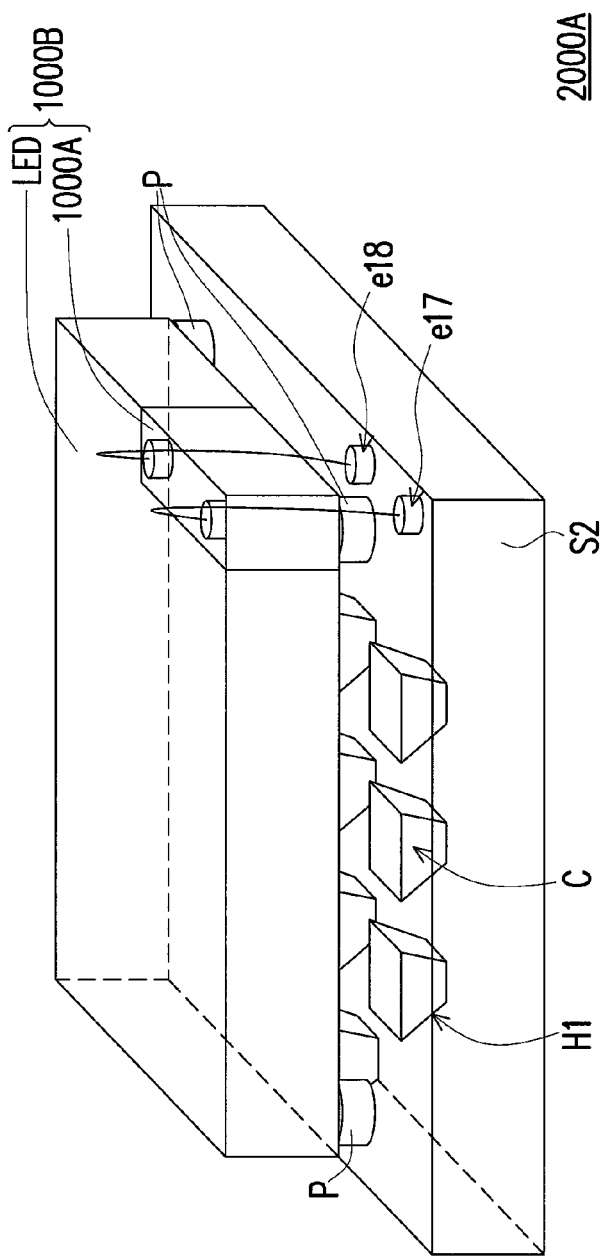
FIG. 16 is a schematic diagram of a light emitting device 2000A according to an embodiment of the present invention.

FIG. 16 is a schematic diagram of a light emitting device according to another embodiment of the present invention. A light emitting device 2000A in FIG. 16 is similar to the light emitting device 2000 in FIG. 12. The only difference is that the capacitor C of the light emitting device 2000A is formed on another substrate. Electrical connections among the capacitor C and other elements are the same as the light emitting device 2000 and will not be repeated herein.

Referring to FIG. 16, the LED marked in FIG. 16 represents the light emitting diode in FIG. 12, and the 1000A marked in FIG. 16 represents elements other than the light emitting diode and the capacitor C. The light emitting device 2000A in FIG. 16 further includes a supplementary substrate S2 having a plurality of hollows H1, in which the capacitor C may be formed. The capacitor C may electrically connect the light emitting diode and the other elements 1000A in an external way.

Figure 17:
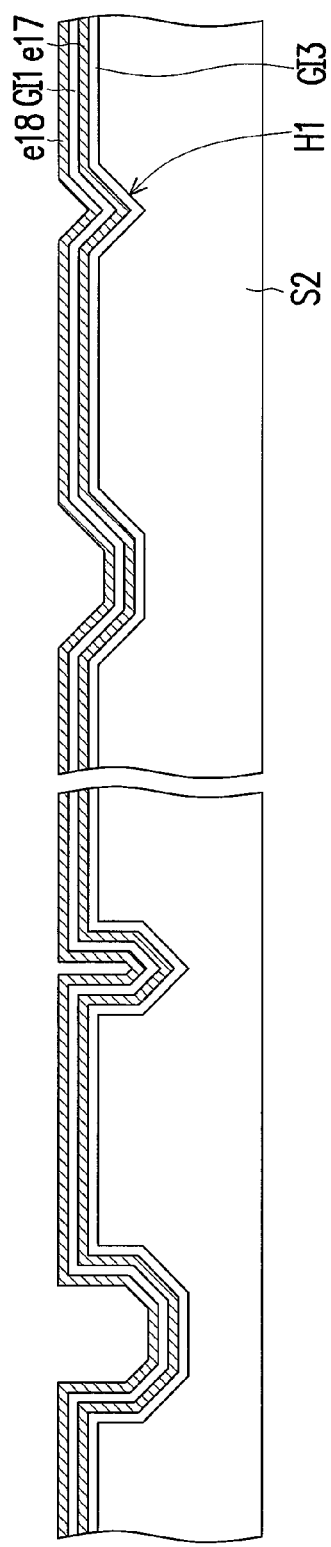
FIG. 17 is a cross-section diagram of the supplementary substrate and the capacitor in FIG. 16.

FIG. 17 is a cross-section diagram of the supplementary substrate and the capacitor in FIG. 16. Referring to FIG. 17, in the light emitting device 2000A, the supplementary substrate S2 further includes an insulating layer GI3, wherein the insulating layer GI3 is formed within the hollows H1. The capacitor C is formed on top of the insulating layer GI3. To be more specific, the electrode e17, the electrode 18, and the first insulating layer GI1 of the capacitor C are formed on top of the insulating layer GI3. In the present embodiment, shapes of the hollows H1 are not restricted, and they may be adjusted according to an actual manufacturing requirement. Additionally, the shapes of the hollows H1 on the supplementary substrate S2 may be the same or different. The supplementary substrate S2 is, for example, a silicon substrate, and yet the present invention is not limited thereto.

It is noted that the capacitor C is formed within the hollows H1 on another substrate (i.e. the supplementary substrate S2). Surface areas of the electrodes e17 and e18 of the capacitor C are able to be increased so as to increase the capacitance of the capacitor C and further enhance an electrical performance of the light emitting device 2000A.

Additionally, the supplementary substrate S2 in the present embodiment may include a plurality of convex portions P. A die 1000B composed of the other elements 1000A (which include the semiconductor field effect transistor, the first Schottky diode DS1, the second Schottky diode DS2, the third Schottky diode DS3, the fourth Schottky diode DS4 and the resistor R) and the light emitting diode may be coupled to the top of the convex portions P. At least a portion of the light emitted by the light emitting diode may be scattered by the hollows H1 and leave the light emitting device 2000A. In other words, the hollows H1 of the supplementary substrate S2 may not only enhance the electrical performance but also an optical performance of the light emitting device 2000A.

Figure 18:
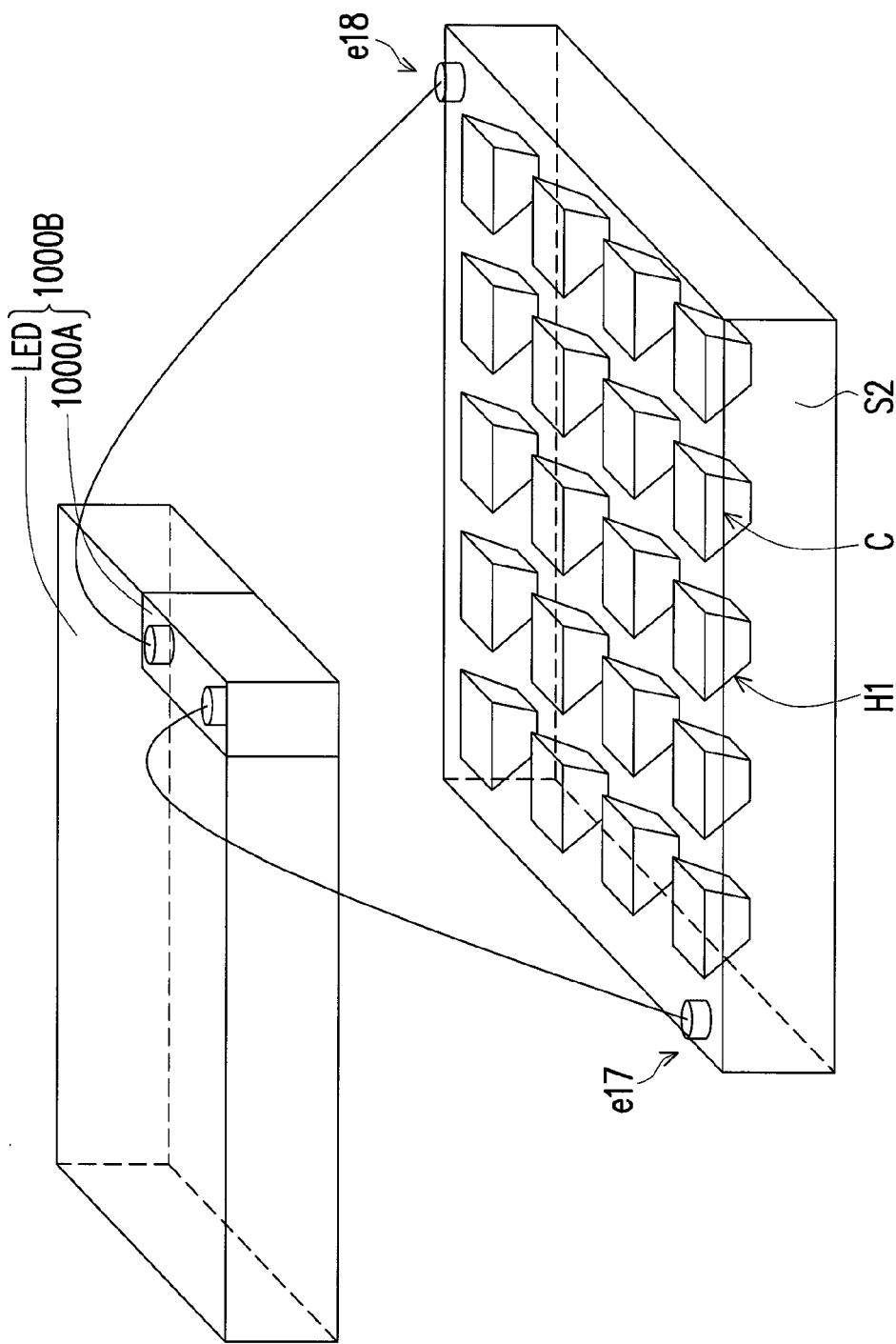
FIG. 18 is a schematic diagram of a light emitting device 2000B according to an embodiment of the present invention.
Figure 19:
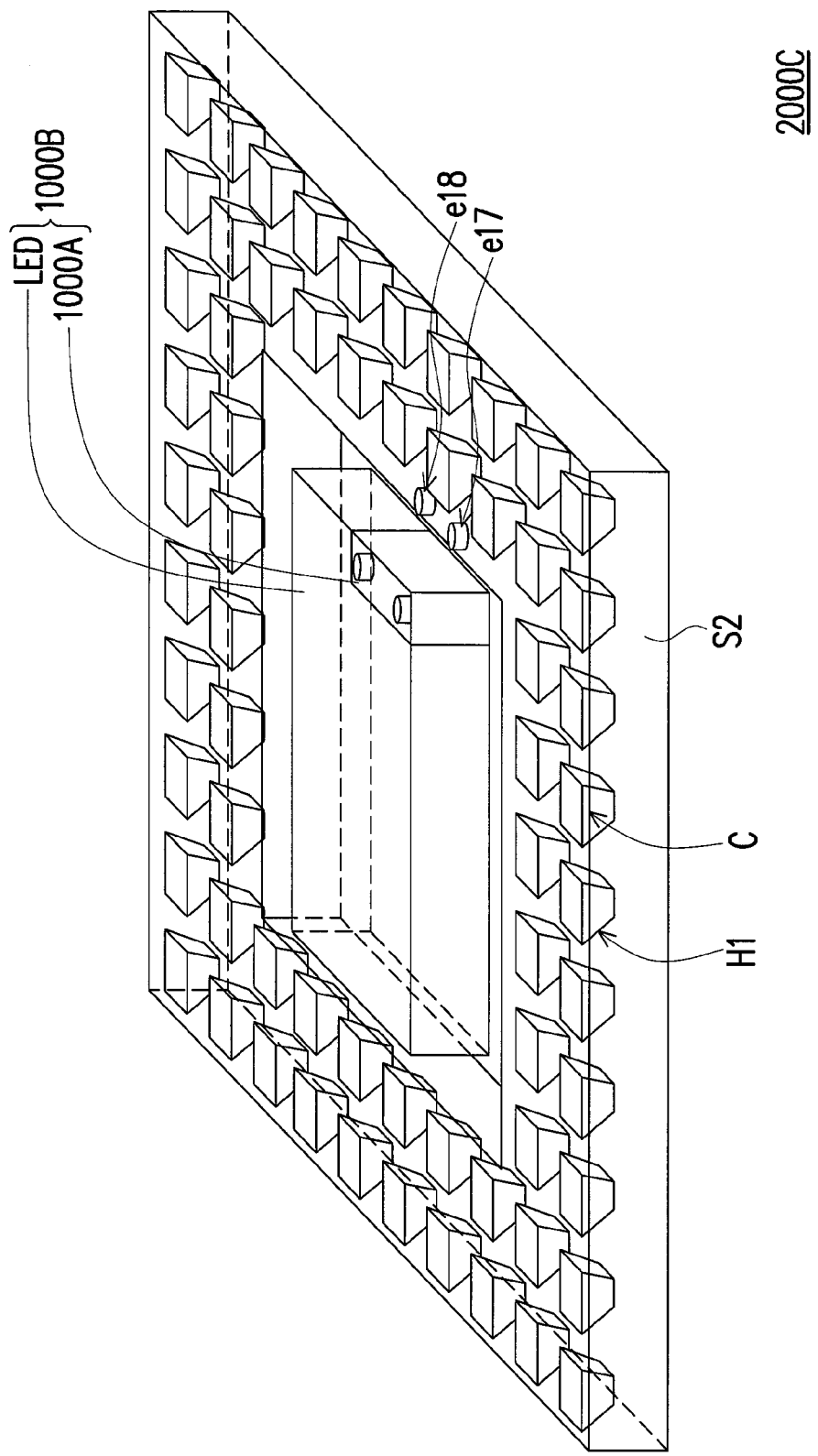
FIG. 19 is a schematic diagram of a light emitting device 2000C according to an embodiment of the present invention.

However, relative positions between the supplementary substrate S2 and the die 1000B are not limited to FIG. 16. FIG. 18 is a schematic diagram of a light emitting device according to an embodiment of the present invention. A light emitting device 2000B in FIG. 18 is similar to the light emitting device 2000A, except that the supplementary substrate S2 is disposed beside the die 1000B. FIG. 19 is a schematic diagram of a light emitting device according to another embodiment of the present invention. A light emitting device 2000C in FIG. 19 is similar to the light emitting device 2000A, except that the die 1000B is surrounded by the supplementary substrate S2.

Figure 20:
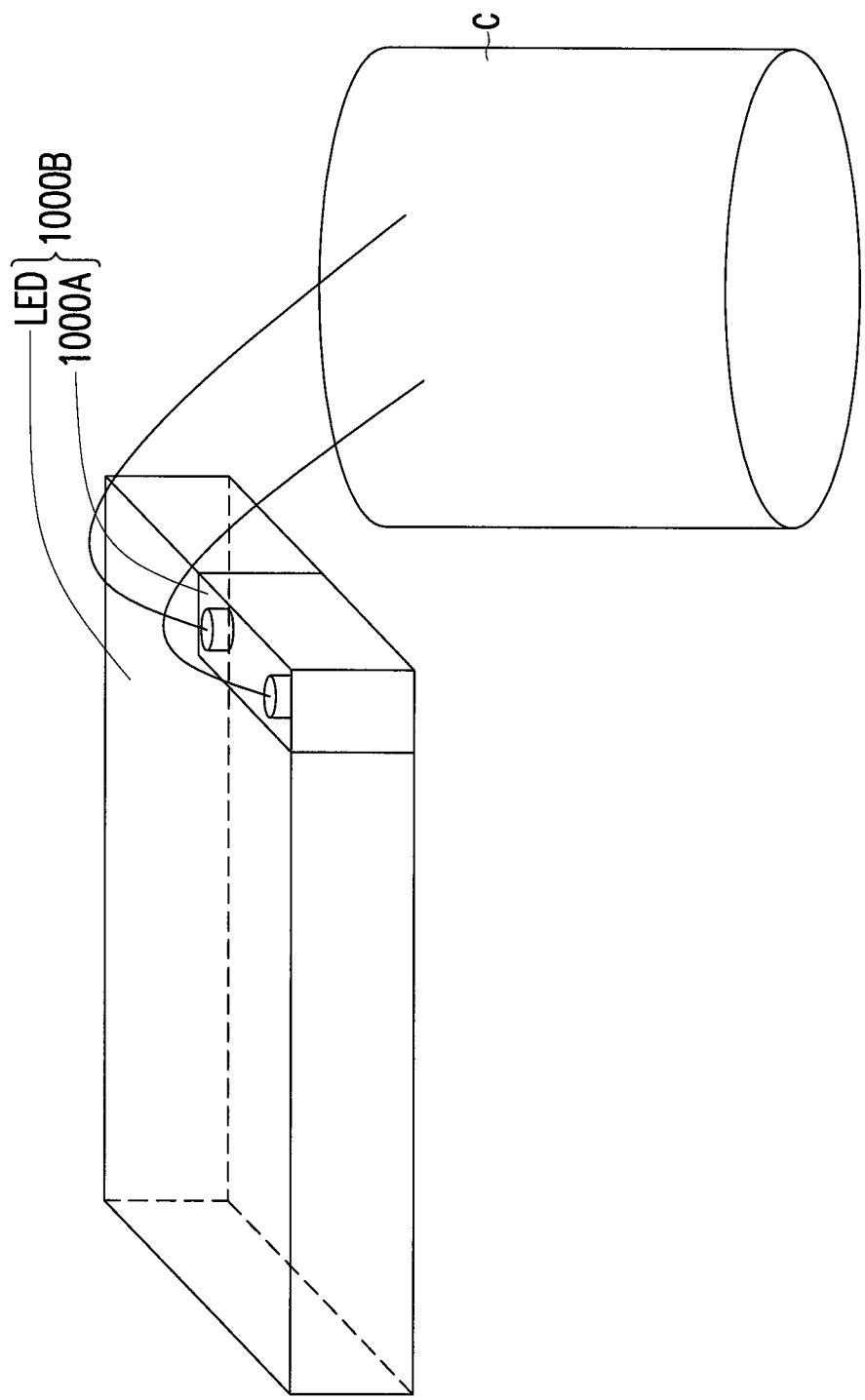
FIG. 20 is a schematic diagram of a light emitting device 2000D according to an embodiment of the present invention.

FIG. 20 is a schematic diagram of a light emitting device according to another embodiment of the present invention. The light emitting device 2000D in FIG. 20 is similar to the light emitting device 2000A, except that the light emitting device 2000D may exclude the supplementary substrate S2, and the capacitor C may be a commercially available capacitor, which may electrically connect the die 1000B in an external way.

The Third Embodiment

Figure 21:
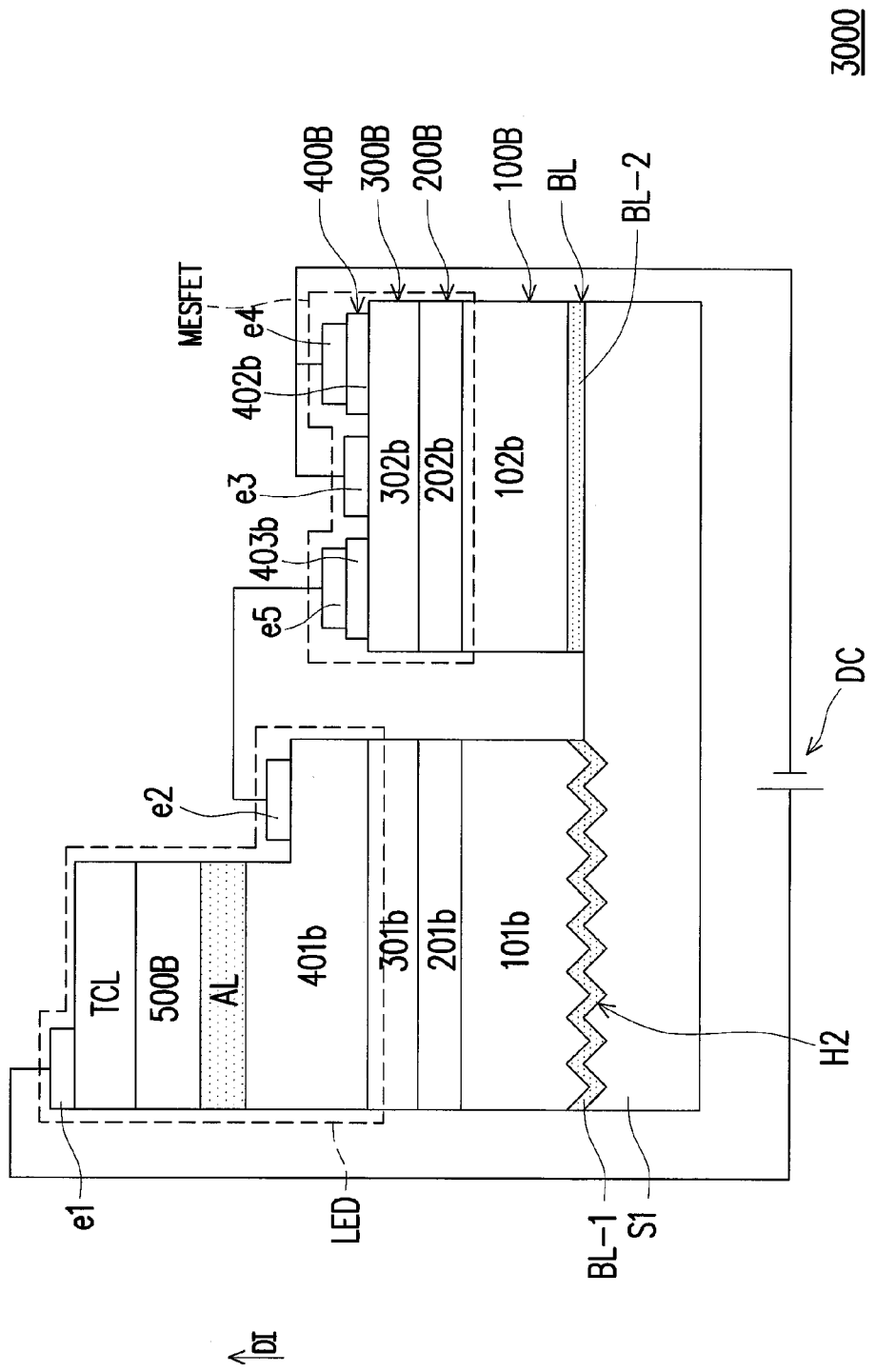
FIG. 21 is a schematic diagram of a light emitting device 3000 according to an embodiment of the present invention.

FIG. 21 is a schematic diagram of a light emitting device according to an embodiment of the present invention. Referring to FIG. 21, a light emitting device 3000 of the present invention includes a growth substrate S1, a first type semiconductor layer 100B, a second type semiconductor layer 200B formed on top of the first type semiconductor layer 100B, a third type semiconductor layer 300B formed on top of the second type semiconductor layer 200B, and a fourth type semiconductor layer 400B formed on top of the third type semiconductor layer 300B. In the present embodiment, a first semiconductor region 401*b*, a source semiconductor region 402*b* and a drain semiconductor region 403*b* are separated from the fourth type semiconductor layer 400B. An active layer AL is formed on top of the first semiconductor region 401*b*, and a second semiconductor region 500B is formed on top of the active layer AL. A third semiconductor region 301*b* and a channel semiconductor region 302*b* are separated from the third type semiconductor layer 300B. A fourth semiconductor region 201*b* and a base region 202*b* are separated from the second type semiconductor layer 200B. A fifth semiconductor region 101*b* and a sixth semiconductor region 102*b* are separated from the first type semiconductor layer 100B. The active layer AL and the second semiconductor region 500B expose a portion of the first semiconductor region 401*b*. The source semiconductor region 402*b* and the drain semiconductor region 403*b* are positioned on two opposite sides on top of the channel semiconductor region 302*a* and expose a portion of the channel semiconductor region 302*b*.

In the present embodiment, the growth substrate S1 may be a sapphire substrate, GaN substrate or Si substrate for example, and yet the present invention is not limited thereto. In the present embodiment, a material of the first type semiconductor layer 100B may be an undoped III-nitride such as an undoped gallium nitride (GaN), aluminum gallium nitride (AlGaN), or indium gallium nitride (InGaN), and yet the present invention is not limited thereto. In the present embodiment, a material of the second type semiconductor layer 200B may be a semi-insulated III-nitride such as a semi-insulated gallium nitride (GaN), aluminum gallium nitride (AlGaN), or indium gallium nitride (InGaN), and yet the present invention is not limited thereto. In the present embodiment, materials of the third type semiconductor layer 300B, the fourth type semiconductor layer 400B, and the fifth type semiconductor layer 500B may respectively be an n-type, an n-type, and a p-type III-nitride, and yet the present invention is not limited thereto. The n-type III-nitride may be, for example, an n-type gallium nitride (n-GaN), an n-type aluminum gallium nitride (n-AlGaN), or an n-type indium gallium nitride (n-InGaN). The p-type III-nitride may be, for example, a p-type gallium nitride (p-GaN), a p-type aluminum gallium nitride (p-AlGaN), or a p-type indium gallium nitride (p-InGaN). The active layer AL may include multiple quantum wells. In other words, the active layer AL is a light emitting layer, which may emit light when being enabled. Moreover, a doping concentration of the fourth type semiconductor layer 400B may be greater than that of the third type semiconductor layer 300B in the present embodiment.

In the present embodiment, the first semiconductor region 401*b*, the active layer AL, a second semiconductor region 500B, a transparent conductive layer (TCL), an electrode e1, and an electrode e2 may overlap in a direction D1 vertically departing from the growth substrate S1 to constitute a light emitting diode. The third semiconductor region 301*b*, the fourth semiconductor region 201*b*, and the fifth semiconductor region 101*b* overlap with the light emitting diode. The electrode e1 may electrically connect the second semiconductor region 500B via the transparent conductive layer (TCL), and the electrode e2 may electrically connect the first semiconductor region 401*b*. The base region 202*b*, the channel semiconductor region 302*b*, the source semiconductor region 402*b*, the drain semiconductor region 403*b*, a gate electrode e3, a source electrode e4, and a drain electrode e5 may overlap in the direction DI vertically departing from the growth substrate S1 to constitute a MESFET or HEMT. The sixth semiconductor region 102*b* overlaps with the semiconductor field effect transistor. The gate electrode e3 may form a Schottky contact with the channel semiconductor region 302*b* exposed by the source semiconductor region 402*b* and the drain semiconductor region 403*b*. The source electrode e4 and the drain electrode e5 may respectively form ohmic contacts with the source semiconductor region 402*b* and the drain semiconductor region 403*b*. When the base region 202*b* is, for example, a semi-insulated III-nitride, it may electrically isolate the semiconductor field effect transistor from the elements below such as the sixth semiconductor region 102*b*.

Additionally, the light emitting device 3000 in the present embodiment may further include a buffer layer BL formed between the growth substrate S1 and the first type semiconductor layer 100B. A material of the buffer layer BL may be aluminum nitride, and yet the present invention is not limited thereto. A first buffer region BL-1 and a second buffer region BL-2 are separated from the buffer layer BL. The first buffer region BL-1 overlaps with the light emitting diode in the direction DI, and the second buffer region BL-2 overlaps with the semiconductor field effect transistor in the direction DI. In the present embodiment, the growth substrate S1 includes a plurality of hollows H2, wherein the hollows H2 overlap with the light emitting diode in the direction DI and the first buffer region BL-1 may fill into the hollows H2. However, a structure of the growth substrate S1 of the present invention is not limited to FIG. 21. In another embodiment of the present invention, the plurality of the hollows H2 may be all across a surface of the growth substrate S1 facing the light emitting diode and the semiconductor field effect transistor so as to facilitate the manufacturing process. In other words, in the present embodiment, the hollows H2 may overlap with the light emitting diode and the semiconductor field effect transistor in the direction DI. In another embodiment of the present invention, the surface of the growth substrate S1 facing the light emitting diode and the semiconductor field effect transistor may also be an entirely smooth surface.

Figure 22:
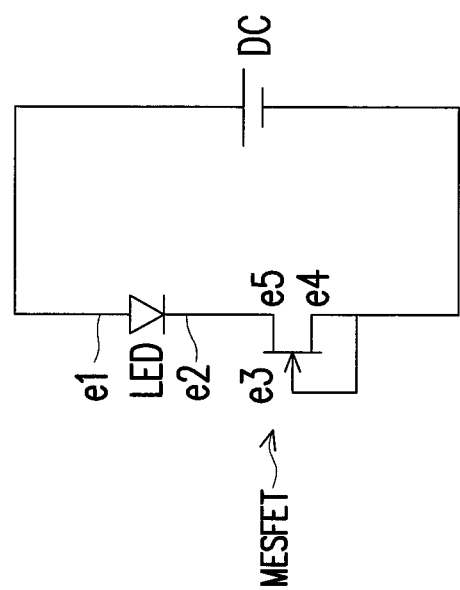
FIG. 22 is an equivalent circuit diagram of the light emitting device 3000 in FIG. 21.

FIG. 22 is an equivalent circuit diagram of the light emitting device in FIG. 21. Referring to FIG. 21 and FIG. 22, the light emitting device 3000 in the present invention further includes a direct-current power source DC, wherein the direct-current power source DC includes a positive electrode and a negative electrode. The positive electrode of the direct-current power source DC electrically connects the electrode e1 of the light emitting diode. The electrode e2 of the light emitting diode electrically connects the drain electrode e5 of the semiconductor field effect transistor. The gate electrode e3 of the semiconductor field effect transistor electrically connects the source electrode e4 thereof. The source electrode e4 of the semiconductor field effect transistor electrically connects the negative electrode of the direct-current power source DC. It is noted that the semiconductor field effect transistor with the gate electrode e3 and the source electrode e4 electrically connected may produce a current-limiting effect on the light emitting diode and further protect the light emitting diode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device comprising:
   a growth substrate;
   a light emitting diode formed on said growth substrate, comprising:
   a first first semiconductor layer;
   an active layer formed on said first first semiconductor layer; and
   a second semiconductor layer formed on said active layer;
   a semiconductor field effect transistor formed on said growth substrate, comprises:
   a base layer;
   a second first semiconductor layer formed on said base layer;
   a channel semiconductor layer formed on said second first semiconductor layer;
   a third semiconductor layer formed on said channel semiconductor layer
   a gate electrode formed a Schottky contact on the channel semiconductor layer; and
   a source electrode and a drain electrode respectively formed on said channel semiconductor layer; and
   a circuit pattern electrically connecting said semiconductor field effect transistor to form a current stabilizing unit and electrically coupling said current stabilizing unit to said light emitting diode,
   wherein said light emitting diode and said semiconductor field effect transistor are separated and stacked respectively on said growth substrate.

2. The light emitting device of claim 1, wherein said device further comprising a power source coupled to said light emitting diode and said current stabilizing unit via said circuit pattern.

3. The light emitting device of claim 1, wherein the said circuit pattern electrically couples said gate electrode of the said transistor to the said source electrode of the said transistor.

4. The light emitting device of claim 1, further comprising a Schottky diode formed on said growth substrate.

5. The light emitting device of claim 1, further comprising a voltage drop delay structure, wherein said voltage drop delay structure is formed by a parallel connection between a capacitor and a resistor, and
   wherein the voltage drop delay structure is formed on said growth substrate and coupled to said light emitting diode.

6. The light emitting device of claim 1 further comprising a supplementary substrate having a plurality of hollows,
   wherein said light emitting diode is coupled to said supplementary substrate, and
   wherein at least a portion of light emitted by said light emitting diode is scattered by the hollows of said supplementary substrate and leave said light emitting device.

7. The light emitting device of claim 6, wherein said light emitting diode is surrounded by said supplementary substrate.

8. The light emitting device of claim 2, wherein the number of the said light emitting diode is more than one, and when the said power source is an alternating-current power source, at least one of the said light emitting diodes is only conducted during a positive voltage half-period and the rest of the said light emitting diodes are only conducted during a negative voltage half-period.

9. The light emitting device of claim 8, wherein said light emitting diodes conducted during a positive voltage half-period and said light emitting diodes conducted during a negative voltage half-period are arranged alternately in pairs.

10. The light emitting device of claim 1 further comprising a Wheatstone bridge rectifying structure electrically coupled to said semiconductor field effect transistor.

11. The light emitting device of claim 10, wherein said Wheatstone bridge rectifying structure comprises said light emitting diode.

12. The light emitting device of claim 10, wherein said Wheatstone bridge rectifying structure comprises at least one Schottky diode.

13. The light emitting device of claim 12, wherein said at least one Schottky diode is formed on said growth substrate.

14. The light emitting device of claim 1, wherein said light emitting diode and said semiconductor field effect transistor are directly on said growth substrate.

15. The light emitting device of claim 1 devoid of a semiconductor layer connecting with said light emitting diode and said semiconductor field effect transistor on said growth substrate.

* * * * *